US012581955B2

(12) United States Patent
Lee et al.

(10) Patent No.: US 12,581,955 B2
(45) Date of Patent: Mar. 17, 2026

(54) ELECTRONIC DEVICES COMPRISING VOLTAGE REGULATOR AND ELECTROMAGNETIC INTERFERENCE (EMI) SHIELDING STRUCTURE TRANSMITTING VOLTAGES

(71) Applicant: Advanced Semiconductor Engineering, Inc., Kaohsiung (TW)

(72) Inventors: Pao-Nan Lee, Kaohsiung (TW); Jung Jui Kang, Kaohsiung (TW); Chang Chi Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 804 days.

(21) Appl. No.: 17/877,799

(22) Filed: Jul. 29, 2022

(65) Prior Publication Data
US 2024/0038679 A1 Feb. 1, 2024

(51) Int. Cl.
*H01L 23/552* (2006.01)
*H01L 23/00* (2006.01)
*H01L 23/31* (2006.01)

(52) U.S. Cl.
CPC ........ *H01L 23/552* (2013.01); *H01L 23/3128* (2013.01); *H01L 24/16* (2013.01); *H01L 2924/15311* (2013.01); *H01L 2924/3025* (2013.01)

(58) Field of Classification Search
CPC ........... H01L 23/552; H01L 2924/3025; H01L 25/0655; H01L 25/16; H01L 23/5383; H01L 23/3128; H01L 2924/15311; H01L 2924/1427; H02K 19/365; H02M 1/44
USPC ........................................... 257/659
See application file for complete search history.

(56) References Cited

U.S. PATENT DOCUMENTS

| | | | |
|---|---|---|---|
| 11,640,944 B2 * | 5/2023 | Kim | H01L 21/4814 257/659 |
| 2011/0205709 A1 * | 8/2011 | Yin | H02M 3/003 29/890.035 |
| 2012/0086109 A1 * | 4/2012 | Kim | H01L 21/561 257/659 |
| 2013/0307128 A1 * | 11/2013 | Lin | H01L 23/552 257/659 |
| 2018/0374798 A1 * | 12/2018 | Lee | H01L 23/552 |
| 2020/0006179 A1 * | 1/2020 | Chen | H01L 23/5226 |
| 2022/0181267 A1 * | 6/2022 | Kung | H01L 23/552 |

* cited by examiner

*Primary Examiner* — Didarul A Mazumder
(74) *Attorney, Agent, or Firm* — Foley & Lardner LLP

(57) ABSTRACT
The present disclosure provides an electronic device. The electronic device includes a first electronic component, a first conductive element, and a voltage regulator. The voltage regulator is disposed adjacent to the first electronic component. The voltage regulator is configured to regulate a first voltage from the first EMI shielding layer and to provide the first electronic component with a second voltage.

20 Claims, 22 Drawing Sheets

ELECTRONIC DEVICES COMPRISING VOLTAGE REGULATOR AND ELECTROMAGNETIC INTERFERENCE (EMI) SHIELDING STRUCTURE TRANSMITTING VOLTAGES

BACKGROUND

1. Field of the Disclosure

The present disclosure generally relates to an electronic device, and more particularly, to an electronic device including a conductive structure configured to transmit a regulated voltage.

2. Description of the Related Art

To reduce signal path and heat dissipation of a higher integration of electronic devices, a shielding layer (such as an electromagnetic interference (EMI) shielding layer) is utilized to transmit a power signal.

However, in some situations, the shielding layer may also incur a relatively large of power loss. Therefore, a new electronic device is required.

SUMMARY

In some embodiments, an electronic device includes a first electronic component, a first conductive element, and a voltage regulator. The voltage regulator is disposed adjacent to the first electronic component. The voltage regulator is configured to regulate a first voltage from the first EMI shielding layer and to provide the first electronic component with a second voltage.

In some embodiments, an electronic device includes an electronic component, a voltage regulator, and an electromagnetic interference (EMI) shielding structure. The first EMI shielding layer is configured to provide the voltage regulator with an input voltage. The second EMI shielding layer is configured to receive a first output voltage from the voltage regulator.

In some embodiments, an electronic device includes a voltage regulator, an electronic component, and an electromagnetic interference (EMI) shielding structure. The EMI structure is configured to shield the electronic component from electromagnetic interference. The EMI shielding structure is further configured to transmit both a first voltage and a second voltage. The second voltage is regulated from the first voltage by the voltage regulator.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
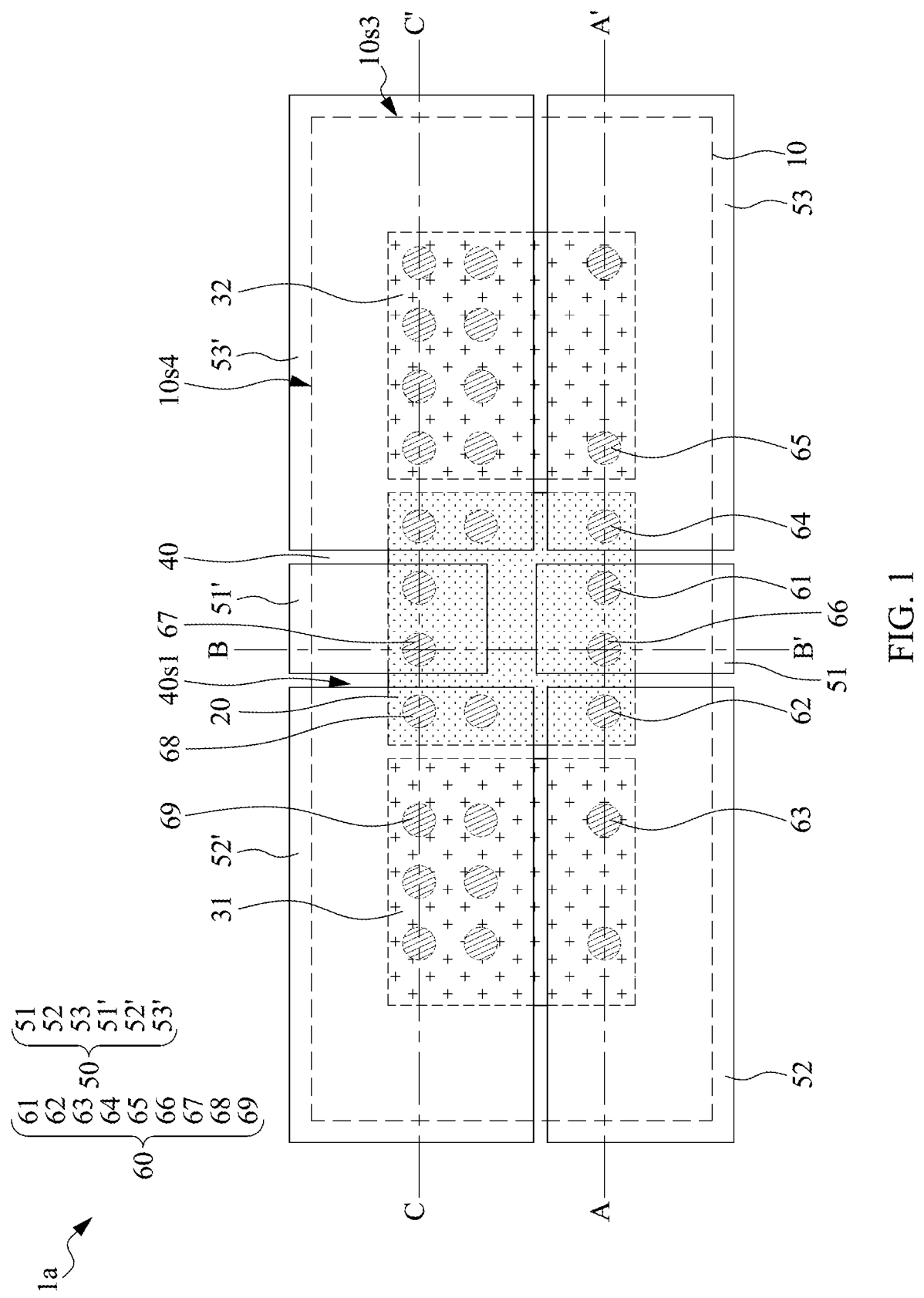
FIG. 1 is a top view of an electronic device, in accordance with an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a top view of an electronic device 1*a*, in accordance with an embodiment of the present disclosure.

In some embodiments, the electronic device 1*a* may include a substrate 10, a voltage regulator 20, an electronic component 31, an electronic component 32, an encapsulant 40, a conductive structure 50, and interconnection structures 60 (e.g., 61, 62, 63, 64, 65, 66, 67, 68 and 69). Each of the interconnection structures 61-69 may also be referred to as a conductive via.

In some embodiments, the conductive structure 50 may include a plurality of conductive elements (e.g., 51, 52, 53, 51', 52' and 53'), which may be configured to transmit electrical signals of different voltages. In some embodiments, the conductive structure 50 may be configured to protect the voltage regulator 20, the electronic component 31, and/or the electronic component 32 from electromagnetic interference (EMI). In some embodiments, the conductive structure 50 may serve as an EMI shielding structure. In some embodiments, the conductive structure 50 may include a conductive material such as a metal or metal alloy. Examples of the conductive material include gold (Au), silver (Ag), copper (Cu), platinum (Pt), Palladium (Pd), other metal(s) or alloy(s), or a combination of two or more thereof. The conductive structure 50 may also be referred to an EMI shielding structure.

In some embodiments, each of the conductive elements 51, 52, 53, 51', 52', and 53' may serve as an EMI shielding layer. In some embodiments, each of the conductive elements 51, 52, 53, 51', 52' and 53' may be configured to laterally and/or vertically protect the electronic components 31 and/or 32 from EMI. Each of the conductive elements 51, 52, 53, 51', 52' and 53' may cover the voltage regulator 20, electronic component 31 and/or 32. In some embodiments, each of the conductive elements 51, 52, 53, 51', 52', and 53' may be physically spaced apart from each other. In some embodiments, each of the conductive elements 51, 52, 53, 51', 52', and 53' is configured to provide a lateral EMI shielding for the electronic components 31 and/or 32. In some embodiments, each of the conductive elements 51, 52, 53, 51', 52', and 53' is configured to provide an EMI shielding for the electronic components 31 and/or 32 from the top of the electronic components 31 and/or 32.

Although there are six conductive elements and two electronic components in FIG. 1, the number of conductive elements and/or electronic components is not limited thereto. In some embodiments, there may be any number of conductive elements and/or electronic components depending on design requirements.

Figure 2A:
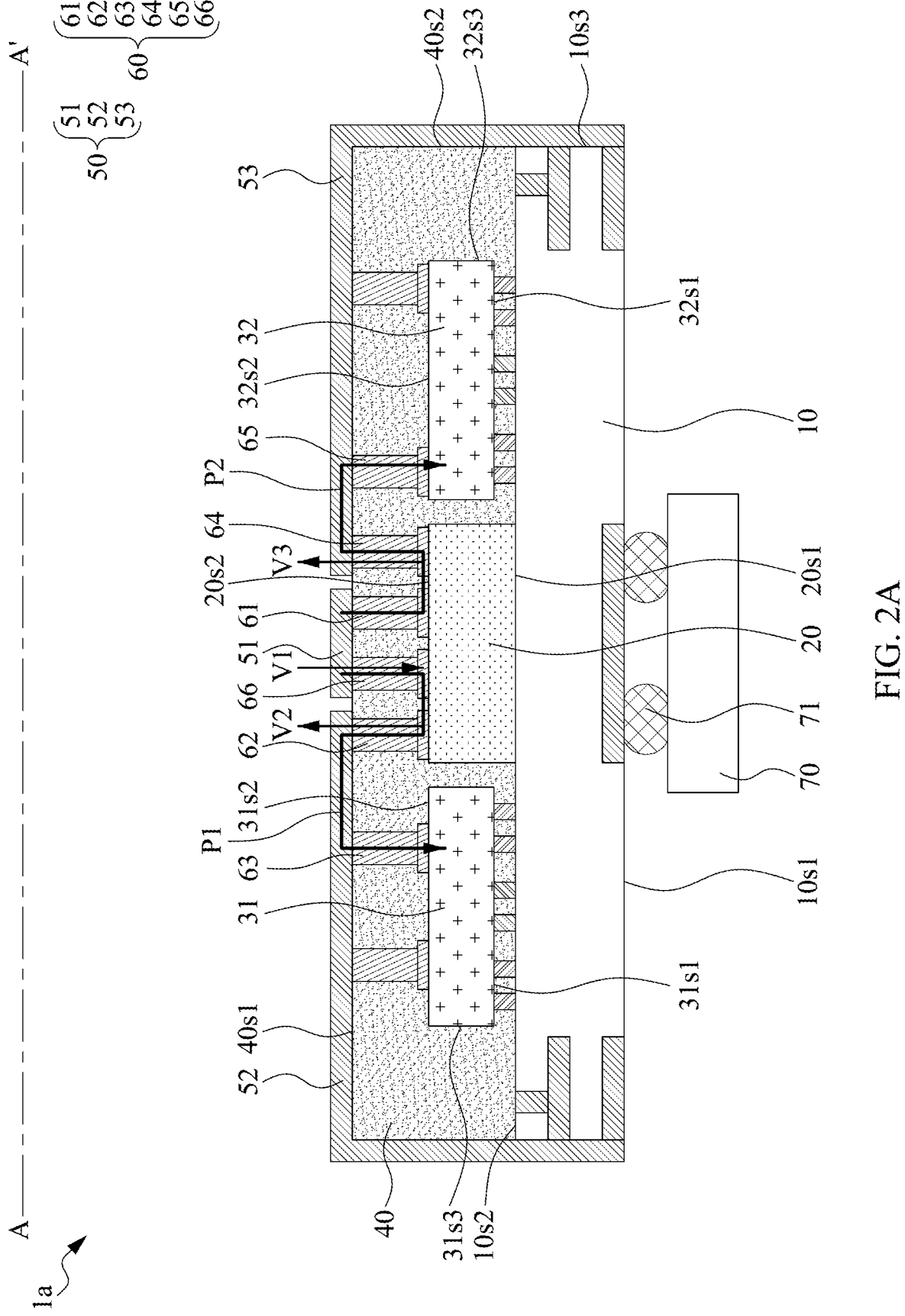
FIG. 2A is a cross-sectional view along line A-A' of the electronic device as shown in FIG. 1, in accordance with an embodiment of the present disclosure.

FIG. 2A is a cross-sectional view along line A-A' of the electronic device 1*a* as shown in FIG. 1, in accordance with an embodiment of the present disclosure.

In some embodiments, the substrate 10 may be or include, for example, a printed circuit board, such as a paper-based copper foil laminate, a composite copper foil laminate, or a polymer-impregnated glass-fiber-based copper foil laminate. In this disclosure, the substrate 10 may also be referred to as a carrier.

The substrate 10 may have a surface 10*s*1 (which may also be referred to as a lower surface), a surface 10*s*2 (which may also be referred to as an upper surface) opposite to the surface 10*s*1, and a surface 10*s*3 extending between the surface 10*s*1 and the surface 10*s*2. The substrate 10 may also have a surface 10*s*4 (shown in FIG. 1), which may be perpendicular to the surface 10*s*3 and extend between the surface 10*s*1 and the surface 10*s*2. The surface 10*s*3 and/or surface 10*s*4 may also be referred to as a lateral surface or a side. In some embodiments, the surface 10*s*3 may also be referred to as a longer side of the substrate 10. In some embodiments, the surface 10*s*4 may also be referred to as a shorter side of the substrate 10. In some embodiments, the surface 10*s*3 of the substrate 10 may be covered by the conductive structure 50. In some embodiments, the surface 10*s*4 of the substrate 10 may be covered by the conductive structure 50.

In some embodiments, the substrate 10 may include a conductive pad(s), trace(s), via(s), layer(s), or other interconnection(s). For example, the substrate 10 may include one or more transmission lines (e.g., communications cables) and one or more grounding lines and/or grounding planes. For example, the substrate 10 may include one or more conductive pads (not shown in the figures) in proximity to, adjacent to, or embedded in and exposed at the surface 10*s*1 and/or the surface 10*s*2 of the substrate 10. The substrate 10 may include a solder resist (not shown in the figures) on the surface 10*s*1 and/or the surface 10*s*2 to fully expose or to expose at least a portion of the conductive pads for electrical connections.

In some embodiments, the voltage regulator 20 may be disposed on or over the surface 10*s*2 of the substrate 10. In some embodiments, the voltage regulator 20 may be disposed between the electronic components 31 and 32. In some embodiments, the voltage regulator 20 may be configured to regulate a power of an electrical signal (e.g., a power signal). In some embodiments, the voltage regulator 20 may be configured to regulate a voltage (e.g., an input voltage or an input power, such as V1). In some embodiments, the voltage regulator 20 may be configured to generate regulated voltage(s) (e.g., an output voltage or an output power, such as V2 and/or V3), and provide the electronic component 31 and/or 32 with the regulated voltage(s). In some embodiments, the voltage regulator 20 may be a chip or a die including a semiconductor substrate, one or more integrated circuit (IC) devices and one or more overlying interconnection structures therein. In some embodiments, the voltage regulator 20 may be a package structure including multiple dies. The voltage regulator 20 may include a surface 20*s*1 and a surface 20*s*2 opposite to the surface 20*s*1. The surface 20*s*1 may also be referred to as an active surface. The surface 20*s*2 may also be referred to as a backside surface.

In some embodiments, the electronic components 31 and 32 may be disposed on or over the surface 10*s*2 of the substrate 10. Each of the electronic components 31 and 32 may be a chip or a die including a semiconductor substrate, one or more integrated circuit (IC) devices and one or more overlying interconnection structures therein. The IC devices may include active devices such as transistors and/or passive devices such as resistors, capacitors, inductors, or a combination thereof. For example, the electronic component 31 and/or 32 may include a system on chip (SoC). For example, the electronic component 31 and/or 32 may include an application-specific IC (ASIC), a radio frequency integrated circuit (RFIC), a central processing unit (CPU), a microprocessor unit (MPU), a graphics processing unit (GPU), a microcontroller unit (MCU), a field-programmable gate array (FPGA), or another type of IC. In some embodiments, the electronic component 31 and/or 32 may be configured to receive the regulated voltage from the voltage regulator 20.

The electronic component 31 may have a surface 31$s$1, a surface 31$s$2 opposite to the surface 31$s$1, and a surface 31$s$3 extending between the surface 31$s$1 and surface 31$s$2. The surface 31$s$1 may also be referred to as an active surface. The surface 31$s$2 may also be referred to as a backside surface. The surface 31$s$3 may also be referred to as a lateral surface. In some embodiments, the electronic component 31 may be electrically connected to the substrate 10 by, for example, flip chip bonding. In some embodiments, the surface 31$s$2 of the electronic component 31 may be configured to receive a power signal. For example, the surface 31$s$2 of the electronic component 31 may be configured to receive a regulated voltage (e.g., V2). A through via (not shown) may extend from the surface 31$s$2 of the electronic component 31 and be configured to transmit a regulated voltage (e.g., V2). In some embodiments, the surface 31$s$1 of the electronic component 31 may be configured to output a data signal (e.g., digital signal, analog signal, radio frequency (RF) signal or the like) to the substrate 10.

The electronic component 32 may have a surface 32$s$1 and a surface 32$s$2 opposite to the surface 32$s$1, and a surface 32$s$3 extending between the surface 32$s$1 and surface 32$s$2. The surface 32$s$1 may also be referred to as an active surface. The surface 32$s$2 may also be referred to as a backside surface. The surface 32$s$3 may also be referred to as a lateral surface. In some embodiments, the electronic component 32 may be electrically connected to the substrate 10 by, for example, flip chip bonding. In some embodiments, the surface 32$s$2 of the electronic component 32 may be configured to receive a power signal. For example, the surface 32$s$2 of the electronic component 32 may be configured to receive a regulated voltage (e.g., V3). A through via (not shown) may extend from the surface 32$s$2 of the electronic component 32 and be configured to transmit a regulated voltage (e.g., V2). In some embodiments, the surface 32$s$1 of the electronic component 32 may be configured to output a data signal (e.g., digital signal, analog signal, RF signal or the like) to the substrate 10.

The encapsulant 40 may be disposed on or over the surface 10$s$2 of the substrate 10. In some embodiments, the encapsulant 40 may encapsulate and/or cover the voltage regulator 20. In some embodiments, the encapsulant 40 may encapsulate and/or cover the electronic component 31. In some embodiments, the encapsulant 40 may encapsulate and/or cover the electronic component 32. In some embodiment, the encapsulant 40 may include an epoxy resin having fillers, a molding compound (e.g., an epoxy molding compound or other molding compound), a polyimide, a phenolic compound or material, a material with a silicone dispersed therein, or a combination thereof. Suitable fillers may also be included, such as powdered $SiO_2$. The encapsulant 40 may have a surface 40$s$1 and a surface 40$s$2. The surface 40$s$1 may also be referred to as an upper surface. The surface 40$s$2 may also be referred to as a lateral surface. The surface 10$s$3 of the substrate 10 may be substantially coplanar with the surface 40$s$2 of the encapsulant 40. In some embodiments, a portion of the surface 40$s$1 of the encapsulant 40 may be exposed by the conductive structure 50.

In some embodiments, the conductive structure 50 may cover the substrate 10. In some embodiments, the conductive structure 50 may cover the voltage regulator 20. In some embodiments, the conductive structure 50 may cover the electronic components 31 and 32. In some embodiments, the conductive structure 50 may cover the encapsulant 40. In some embodiments, the conductive structure 50 may serve as a medium for transmitting both an unregulated voltage (e.g., V1) and a regulated voltage (e.g., V2 and/or V3).

In some embodiments, the conductive element 51 may be disposed over the voltage regulator 20. The conductive element 51 may be electrically connected to the voltage regulator 20 through the interconnection structure 61 and/or 66. The conductive element 51 may cover the surface 40$s$1 of the encapsulant 40. In some embodiments, the conductive element 51 may cover a portion of the voltage regulator 20. In some embodiments, the conductive element 51 may be configured to receive an input voltage (e.g., V1) and provide the conductive element 52 with the output voltage (e.g., V2 and/or V3). The voltage V1 may pass through the interconnection structure 61. The voltage V1 may pass through the interconnection structure 66. The voltage V2 may pass through the interconnection structure 62. The voltage V2 may pass through the interconnection structure 63. The voltage V3 may pass through the interconnection structure 64. The voltage V3 may pass through the interconnection structure 65. In some embodiments, the electronic component 31 may be exposed by the conductive element 51. In some embodiments, the electronic component 32 may be exposed by the conductive element 51. In some embodiments, the conductive element 51 may be spaced apart from the surface 10$s$3 of the substrate 10. The voltage V1 may be an unregulated voltage. The voltage V2 may be a regulated voltage regulated by the voltage regulator 20. The voltage V3 may be a regulated voltage regulated by the voltage regulator 20.

In some embodiments, the conductive element 52 may be disposed over the electronic component 31. In some embodiments, the conductive element 52 may cover the surface 31$s$2 of the electronic component 31. In some embodiments, the conductive element 52 may cover the surface 31$s$3 of the electronic component 31. In some embodiments, the conductive element 52 may cover the surface 32$s$3 of the electronic component 32. In some embodiments, the conductive element 52 may cover a lateral surface (not annotated in the figures) of the voltage regulator 20. The conductive element 52 may cover the surface 40$s$1 of the encapsulant 40. In some embodiments, the conductive element 52 may cover the electronic component 31. The conductive element 52 may be electrically connected to the voltage regulator 20 through the interconnection structure 62. The conductive element 52 may be electrically connected to the electronic component 31 through the interconnection structure 63. In some embodiments, the conductive element 52 may cover the surface 40$s$2 of the encapsulant 40. In some embodiments, the conductive element 52 may be in contact with the surface 40$s$2 of the encapsulant 40. In some embodiments, the conductive element 52 may cover the surface 10$s$3 of the substrate 10. In some embodiments, the conductive element 52 may be in contact with the surface 10$s$3 of the substrate 10. In some embodiments, the conductive element 52 may be configured to receive a regulated voltage (e.g., V2) from the voltage regulator 20. In some embodiments, the conductive element 52 may be configured to provide the electronic component 31 with a regulated voltage (e.g., V2).

In some embodiments, the conductive element 53 may be disposed over the electronic component 32. In some embodiments, the conductive element 53 may cover the electronic component 32. In some embodiments, the conductive element 53 may cover the surface 32$s$2 of the electronic component 32. In some embodiments, the conductive element 53 may cover the surface 32*s*3 of the electronic component 32. In some embodiments, the conductive element 53 may cover the surface 31*s*3 of the electronic component 31. The conductive element 53 may cover the surface 40*s*1 of the encapsulant 40. The conductive element 53 may be electrically connected to the voltage regulator 20 through the interconnection structure 64. The conductive element 53 may be electrically connected to the electronic component 32 through the interconnection structure 65. In some embodiments, the conductive element 53 may cover the surface 40*s*2 of the encapsulant 40. In some embodiments, the conductive element 53 may be in contact with the surface 40*s*2 of the encapsulant 40. In some embodiments, the conductive element 53 may cover the surface 10*s*3 of the substrate 10. In some embodiments, the conductive element 53 may be in contact with the surface 10*s*3 of the substrate 10. In some embodiments, the conductive element 53 may be configured to receive a regulated voltage (e.g., V3) from the voltage regulator 20. In some embodiments, the conductive element 53 may be configured to provide the electronic component 32 with a regulated voltage (e.g., V3).

Figure 2B:
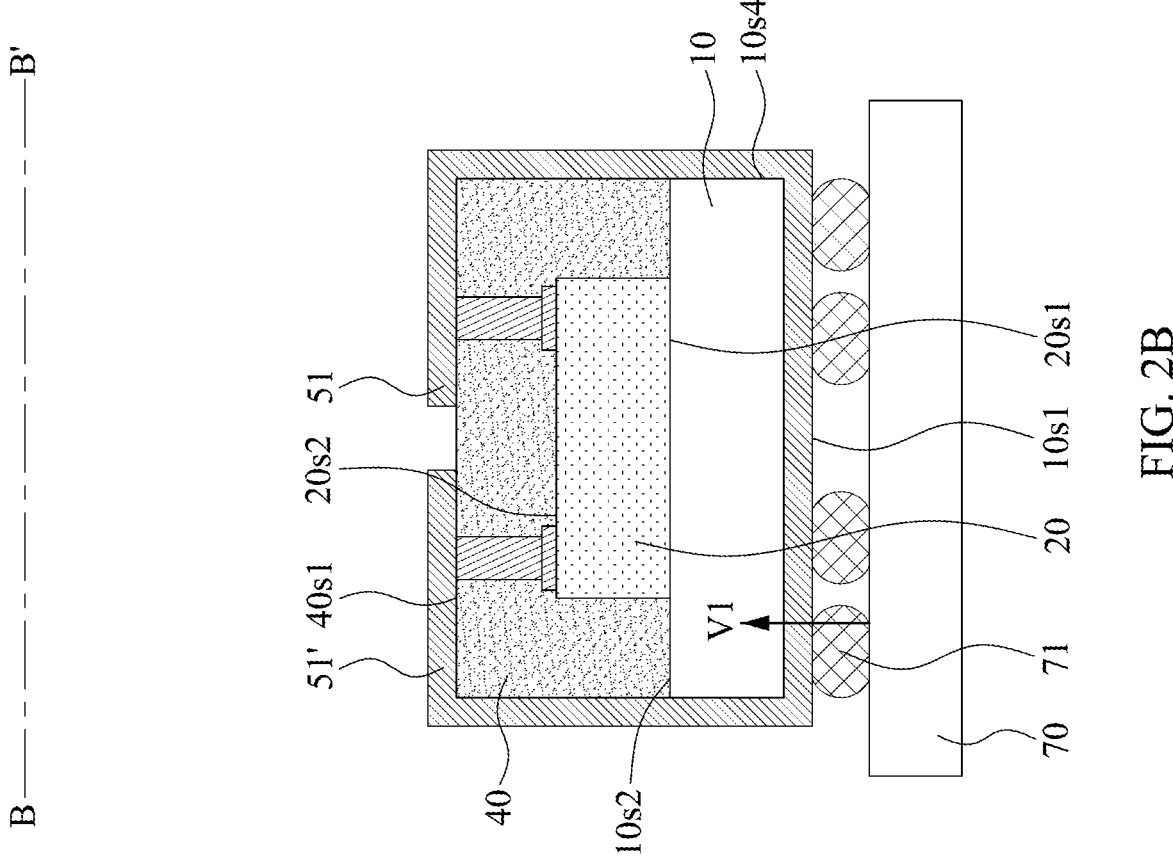
FIG. 2B is a cross-sectional view along line B-B' of the electronic device as shown in FIG. 1, in accordance with an embodiment of the present disclosure.
Figure 2B:

FIG. 2B is a cross-sectional view along line B-B' of the electronic device 1*a* as shown in FIG. 1, in accordance with an embodiment of the present disclosure.

In some embodiments, the electronic device 1*a* may further include a power source 70. In some embodiments, the power source 70 may be disposed on or below the surface 10*s*1 of the substrate 10. The power source 70 may be configured to provide the voltage regulator 20 with a voltage (e.g., V1). In some embodiments, a power signal or a voltage (e.g., V1) may be transmitted to the substrate 10 from the surface 10*s*1 of the substrate 10. As shown in FIG. 2A and FIG. 2B, the voltage V1 may be transmitted from the surface 10*s*1 to the surface 10*s*2 through the surface 10*s*4 of the substrate 10. In some embodiments, the power source 70 may be electrically connected to the conductive element 51 through an electrical connection 71 (e.g., a solder material).

In some embodiments, the conductive element 51 may cover the surface 10*s*4 of the substrate 10. In some embodiments, the conductive element 51 may be in contact with the surface 10*s*4 of the substrate 10. In some embodiments, the conductive element 51' may cover the surface 10*s*4 of the substrate 10. In some embodiments, the conductive element 51' may be in contact with the surface 10*s*4 of the substrate 10. In some embodiments, the conductive elements 51 and 51' may be connected to each other.

In some embodiments, a voltage (e.g., V1) may be transmitted to the voltage regulator 20 through the surface 10*s*4 of the substrate 10, which may reduce power loss.

Figure 2C:
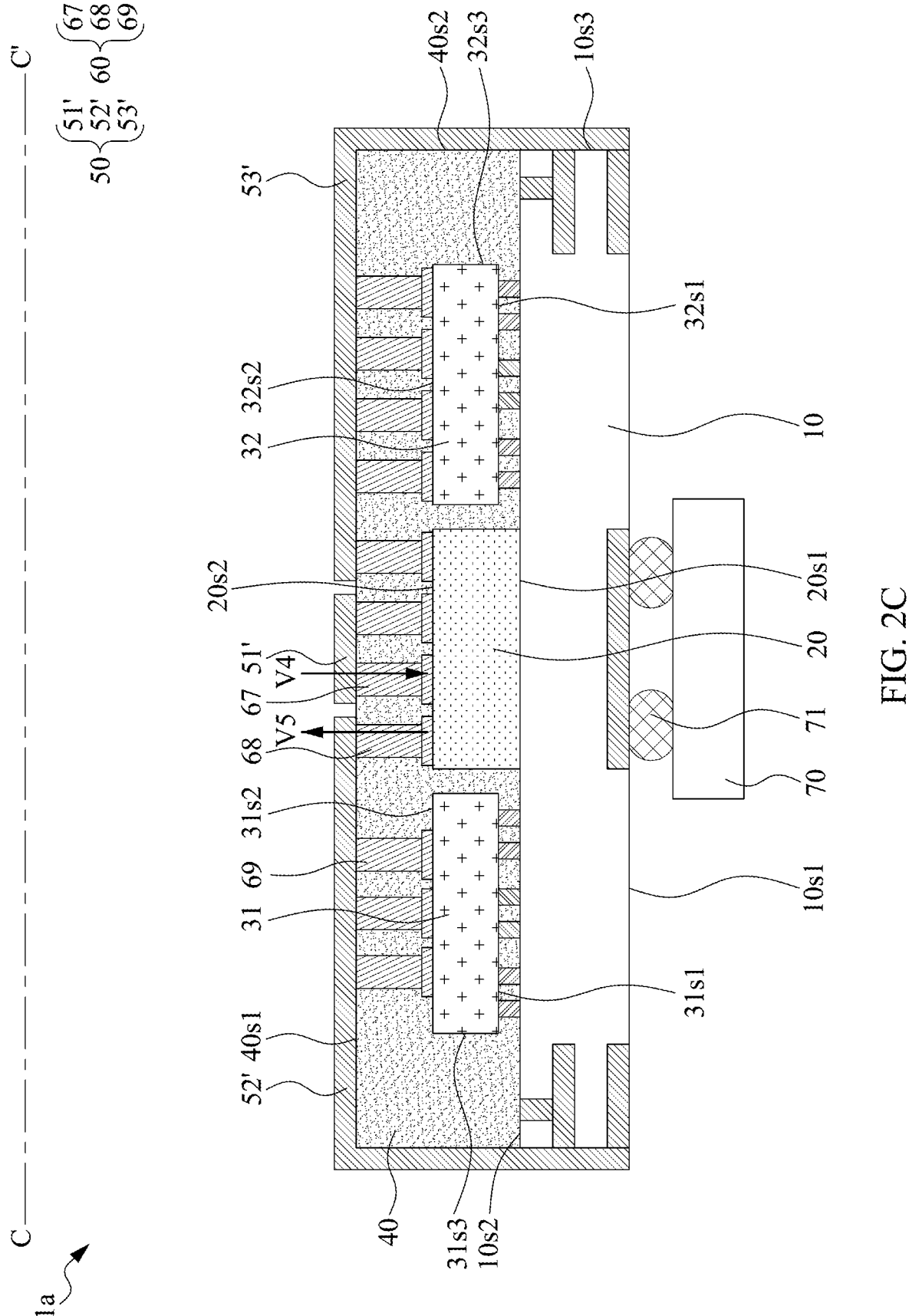
FIG. 2C is a cross-sectional view along line C-C' of the electronic device as shown in FIG. 1, in accordance with an embodiment of the present disclosure.

FIG. 2C is a cross-sectional view along line C-C' of the electronic device 1*a* as shown in FIG. 1, in accordance with an embodiment of the present disclosure.

The power source 70 may be configured to provide the voltage regulator 20 with a voltage (e.g., V4). In some embodiments, the conductive element 51' may be configured to receive an input voltage (e.g., V4) and provide the conductive element 52' with an output voltage (e.g., V5). The voltage V4 may pass through the interconnection structure 67. The voltage V5 may pass through the interconnection structures 68 and 69. In some embodiments, the conductive element 52' may be configured to provide the electronic component 31 with a regulated voltage (e.g., V5). In some embodiments, the voltage V4 (e.g., power or potential) may be different from the voltage V1 (e.g., power or potential). In some embodiments, the voltage V5 (e.g., power or potential) may be different from the voltage V2

(e.g., power or potential). The voltage V4 may be an unregulated voltage. The voltage V5 may be a regulated voltage regulated by the voltage regulator 20.

Figure 2D:
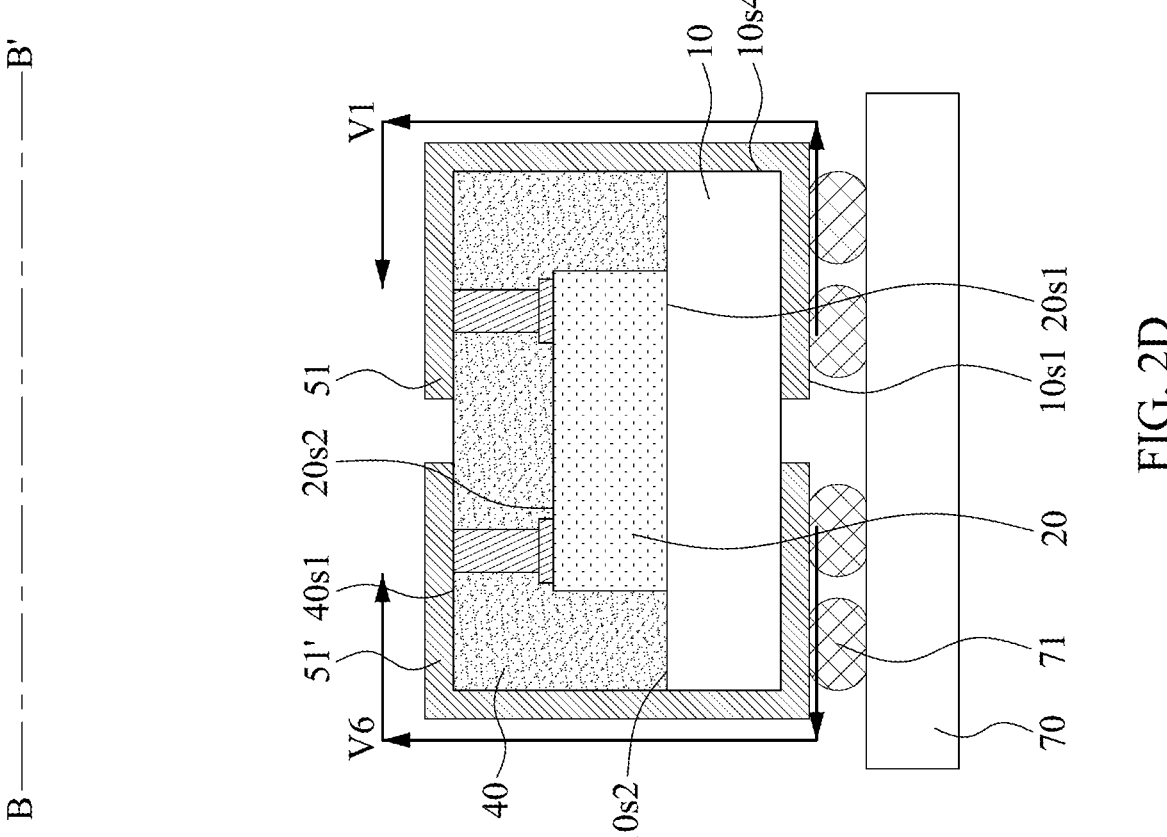
FIG. 2D is a cross-sectional view of an electronic device in accordance with an embodiment of the present disclosure.
Figure 2D:

FIG. 2D is a cross-sectional of an electronic device 1*a'*, in accordance with an embodiment of the present disclosure.

In some embodiments, the conductive elements 51 and 51' may be spaced apart from each other. In some embodiments, the conductive elements 51 and 51' may provide different voltages. For example, the conductive elements 51 may be configured to provide the voltage V1, and the conductive elements 51' may be configured to provide the voltage V6 different from the voltage V1.

As shown in FIG. 2A, the electronic device 1*a* may be configured to provide a signal path P1. In some embodiments, the signal path P1 may pass through the conductive element 51, the voltage regulator 20, the conductive element 52, and the electronic component 31 in order. The power of the signal path P1 may be regulated by the voltage regulator 20. For example, the input voltage of the power signal may be the voltage V1, and the output voltage of the power signal may be the voltage V2, which is regulated from the voltage V1 by the voltage regulator 20. In some embodiments, the voltage V1 may be different from the voltage V2. In some embodiments, the voltage V1 may be greater than voltage V2. In some embodiments, the voltage V1 may be less than voltage V2. In some embodiments, the voltage V1 may be equal to the voltage V2.

The electronic device 1*a* may be configured to provide a signal path P2. In some embodiments, the signal path P2 may pass through the conductive element 51, the voltage regulator 20, the conductive element 53, and the electronic component 32 in order. The power of signal path P2 may be regulated by the voltage regulator 20. For example, the input voltage of the power signal may be the voltage V1, and the output voltage of the power signal may be the voltage V3 which is regulated from the voltage V1 by the voltage regulator 20. In some embodiments, the voltage V1 may be different from the voltage V3. In some embodiments, the voltage V1 may be greater than the voltage V3. In some embodiments, the voltage V1 may be less than the voltage V3. In some embodiments, the voltage V1 may be equal to the voltage V3. In some embodiments, the voltage V2 may be the same as the voltage V3. In some embodiments, the voltage V2 may be different from the voltage V3.

In a comparative semiconductor device, an input voltage, which is not regulated, is transmitted to an electronic component through a shielding layer. In such case, the power loss may be relatively large, which adversely affects the performance of an electronic device. In embodiments of the present disclosure, an input voltage (e.g., V1) is regulated, and an electronic component (e.g., electronic component 31) receives a regulated voltage (e.g., V2) from a voltage regulator (e.g., voltage regulator 20). When the regulated voltage passes through a conductive element (e.g., conductive element 52), the power loss may be reduced, which thereby enhances the performance of an electronic device (e.g., electronic device 1*a*).

Figure 3:
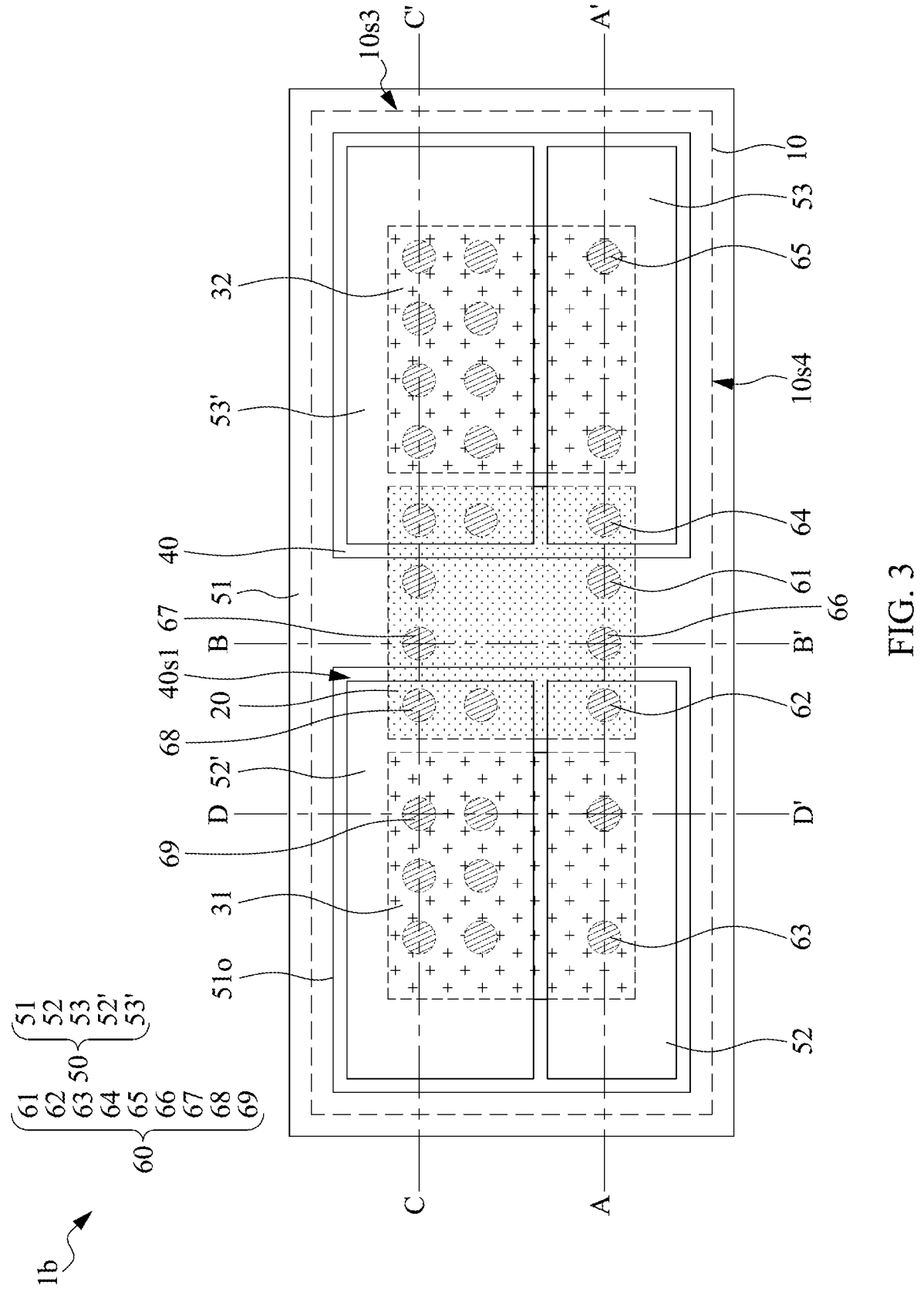
FIG. 3 is a top view of an electronic device, in accordance with an embodiment of the present disclosure.
Figure 4A:
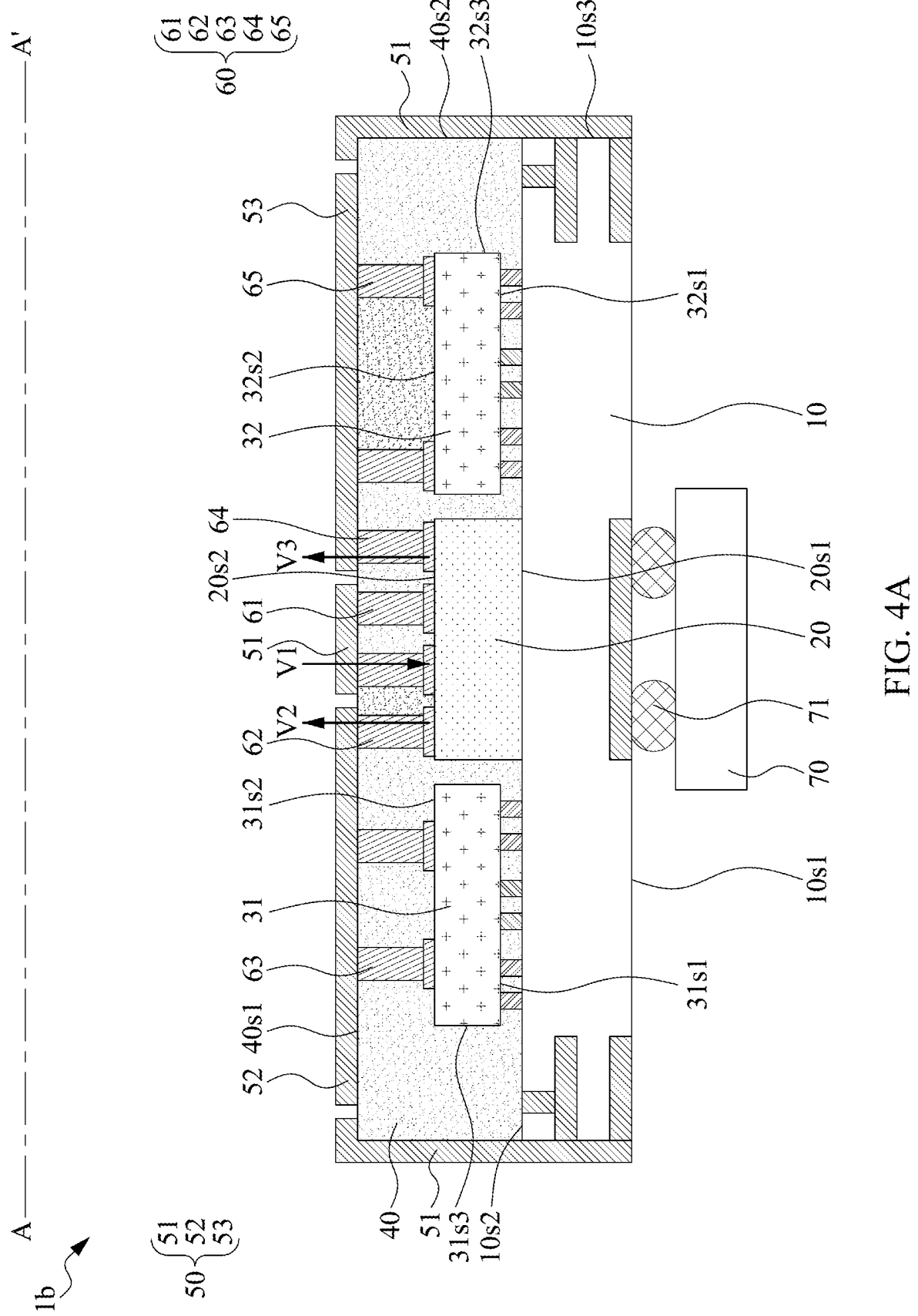
FIG. 4A is a cross-sectional view along line A-A' of the electronic device as shown in FIG. 3, in accordance with an embodiment of the present disclosure.
Figure 4B:
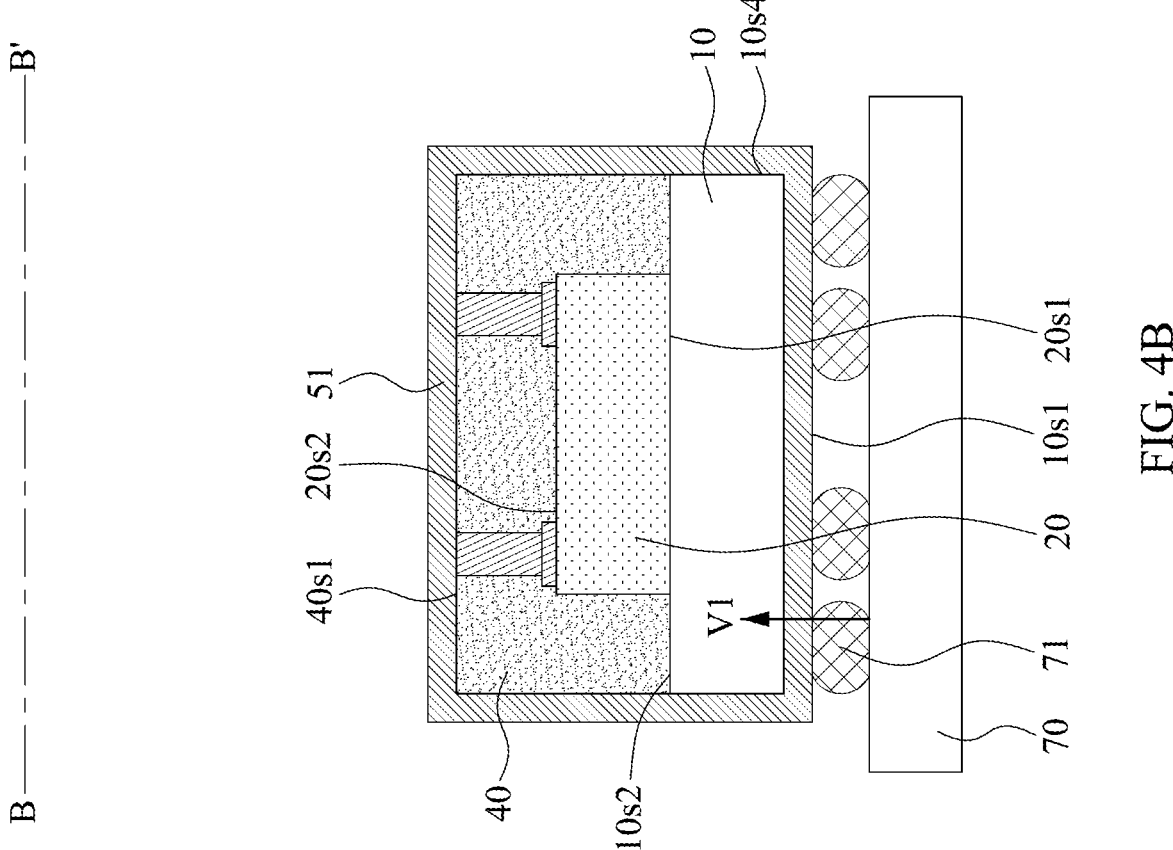
FIG. 4B is a cross-sectional view along line B-B' of the electronic device as shown in FIG. 3, in accordance with an embodiment of the present disclosure.
Figure 4B:

FIG. 3 is a top view of an electronic device 1*b*, in accordance with an embodiment of the present disclosure. FIG. 4A and FIG. 4B are cross-sectional views along line A-A' and B-B' of the electronic device 1*b* as shown in FIG. 3, respectively. The electronic device 1*b* is similar to the electronic device 1*a*, and the differences therebetween are described below.

In some embodiments, the surface 31*s*3 of the electronic component 31 may be exposed by the conductive element 52. In some embodiments, the surface 31*s*3 of the electronic component 31 may be covered by the conductive element 51. In some embodiments, the surface 40$s$2 of the encapsulant 40 may be exposed by the conductive element 52. In some embodiments, the surface 40$s$2 of the encapsulant 40 may be covered by the conductive element 51. In some embodiments, the surface 40$s$2 of the encapsulant 40 may be in contact with the conductive element 51. In some embodiments, the surface 10$s$3 of the substrate 10 may be exposed by the conductive element 52. In some embodiments, the surface 10$s$3 of the substrate 10 may be covered by the conductive element 51. In some embodiments, the surface 10$s$3 of the substrate 10 may be in contact with the conductive element 51. In some embodiments, the conductive element 51 may extend between the surface 10$s$1 of the substrate 10 and the surface 40$s$1 of the encapsulant 40. In some embodiments, the surface 10$s$4 of the substrate 10 may be exposed by the conductive element 52 as shown in FIG. 3. In some embodiments, the surface 10$s$4 of the substrate 10 may be exposed by the conductive element 53 as shown in FIG. 3. In some embodiments, the conductive element 51 may surround the surface 10$s$4 of the substrate 10 as shown in FIG. 4B. In some embodiments, the conductive element 51 may define an opening 51$o$. The electronic component 31 may be exposed from the opening 51$o$. In some embodiments, the conductive element 52 may be disposed within the opening 51$o$. In some embodiments, the conductive element 52' may be disposed within the opening 51$o$.

Figure 4C:
FIG. 4C is a side view of the electronic device as shown in FIG. 3, in accordance with an embodiment of the present disclosure.

FIG. 4C is a side view of the electronic device 1$b$ as shown in FIG. 3, in accordance with an embodiment of the present disclosure.

In some embodiments, the conductive element 51 may vertically overlap the conductive element 52. In some embodiments, the conductive element 51 may vertically overlap the conductive element 53. In some embodiments, an exposed portion of the encapsulant 40 may be disposed between the conductive elements 51 and 52 along a vertical direction. In some embodiments, an exposed portion of the encapsulant 40 may be disposed between the conductive elements 51 and 53 along a vertical direction.

In this embodiment, the conductive element 51 have a relatively large surface area, which thereby further reduces power loss. As a result, the performance of the electronic device 1$b$ may be enhanced.

Figure 4D:
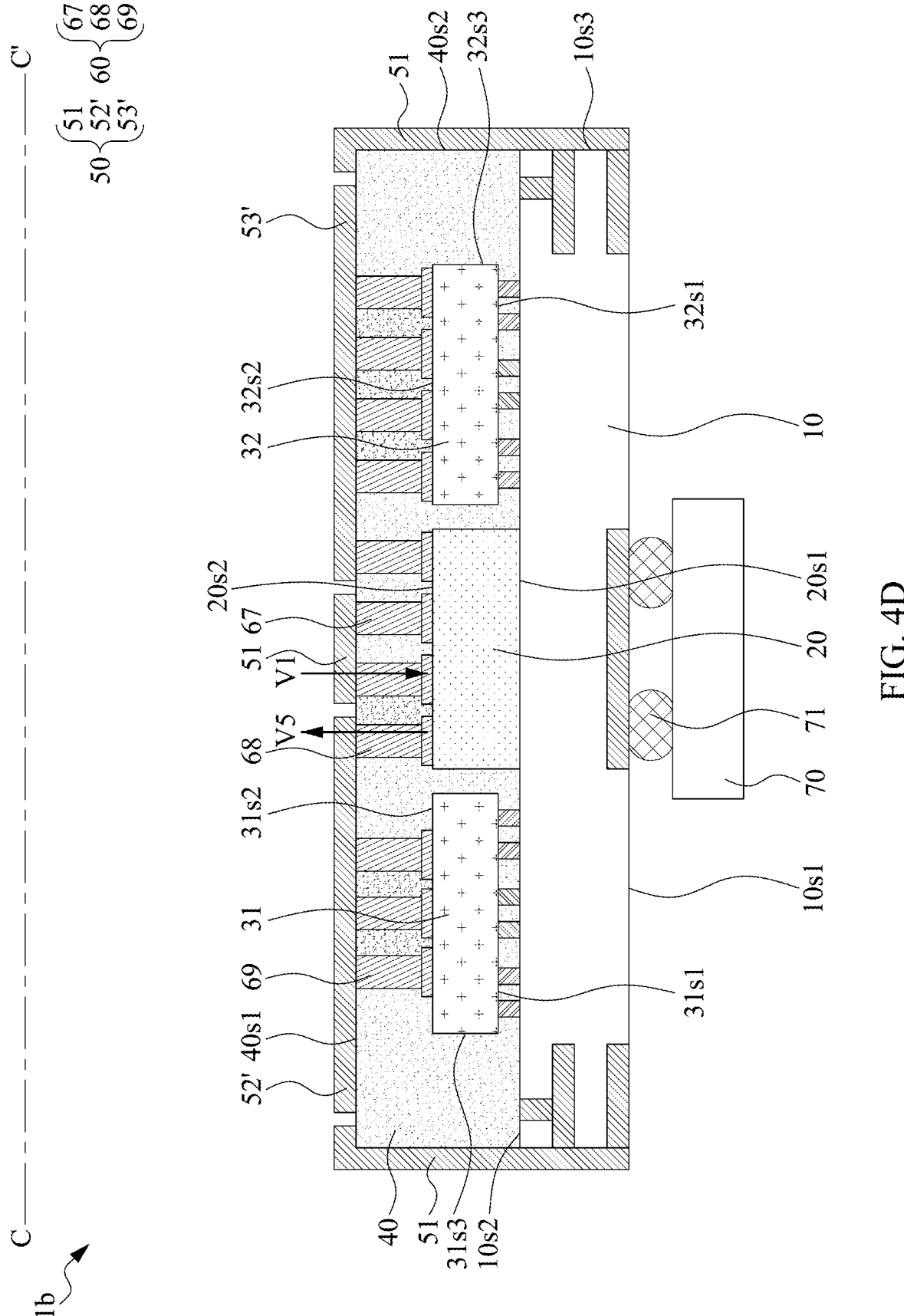
FIG. 4D is a cross-sectional view along line C-C' of the electronic device as shown in FIG. 3, in accordance with an embodiment of the present disclosure.

FIG. 4D is a cross-sectional view along line C-C' of the electronic device 1$b$ as shown in FIG. 3.

As shown in FIG. 4D, the conductive element 51 may be configured to receive an input voltage (e.g., V1) and provide the conductive element 52' with an output voltage (e.g., V5).

Figure 4E:
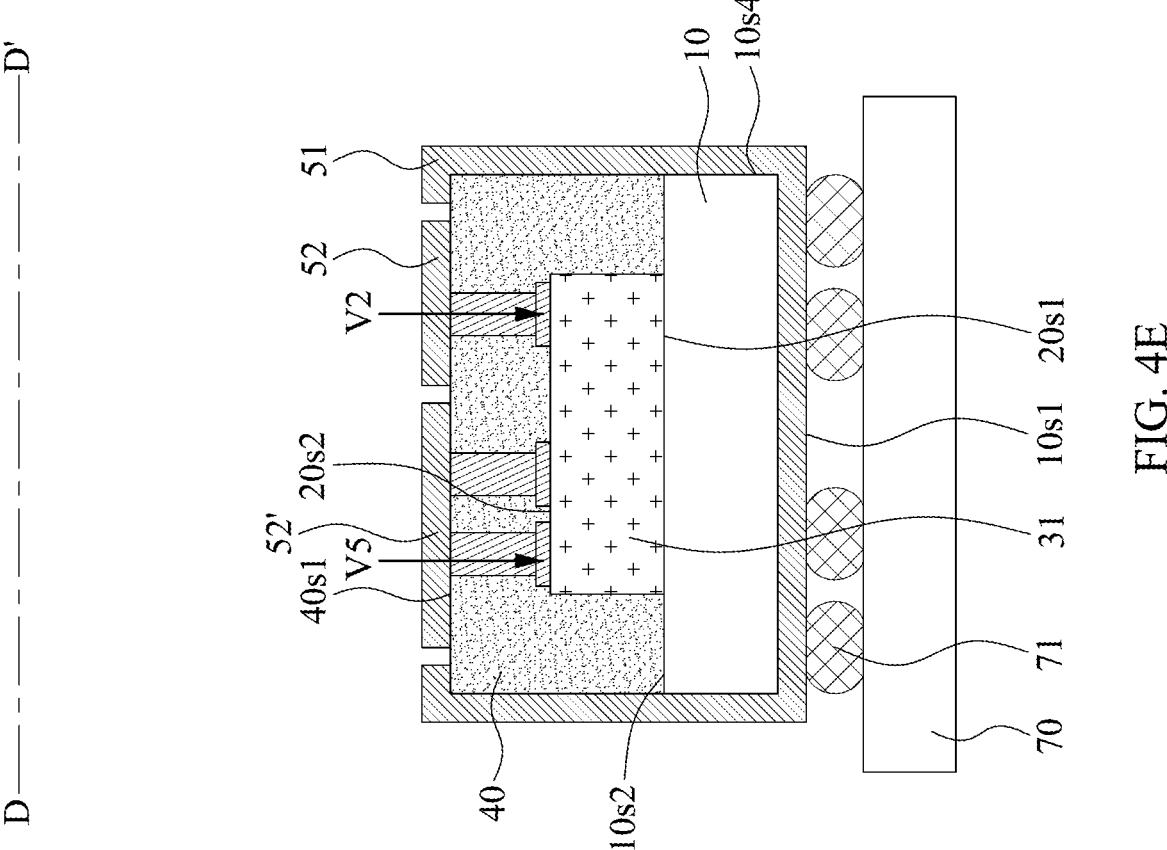
FIG. 4E is a cross-sectional view along line D-D' of the electronic device as shown in FIG. 3, in accordance with an embodiment of the present disclosure.
Figure 4E:

FIG. 4E is a cross-sectional view along line D-D' of the electronic device 1$b$ as shown in FIG. 3.

In some embodiments, a gap is located between the conductive elements 51 and 52'. In some embodiments, a gap is located between the conductive elements 51 and 52. In some embodiments, a gap is located between the conductive elements 52 and 52'. In some embodiments, the electronic component 31 may be configured to receive the voltages V2 and V5.

Figure 5:
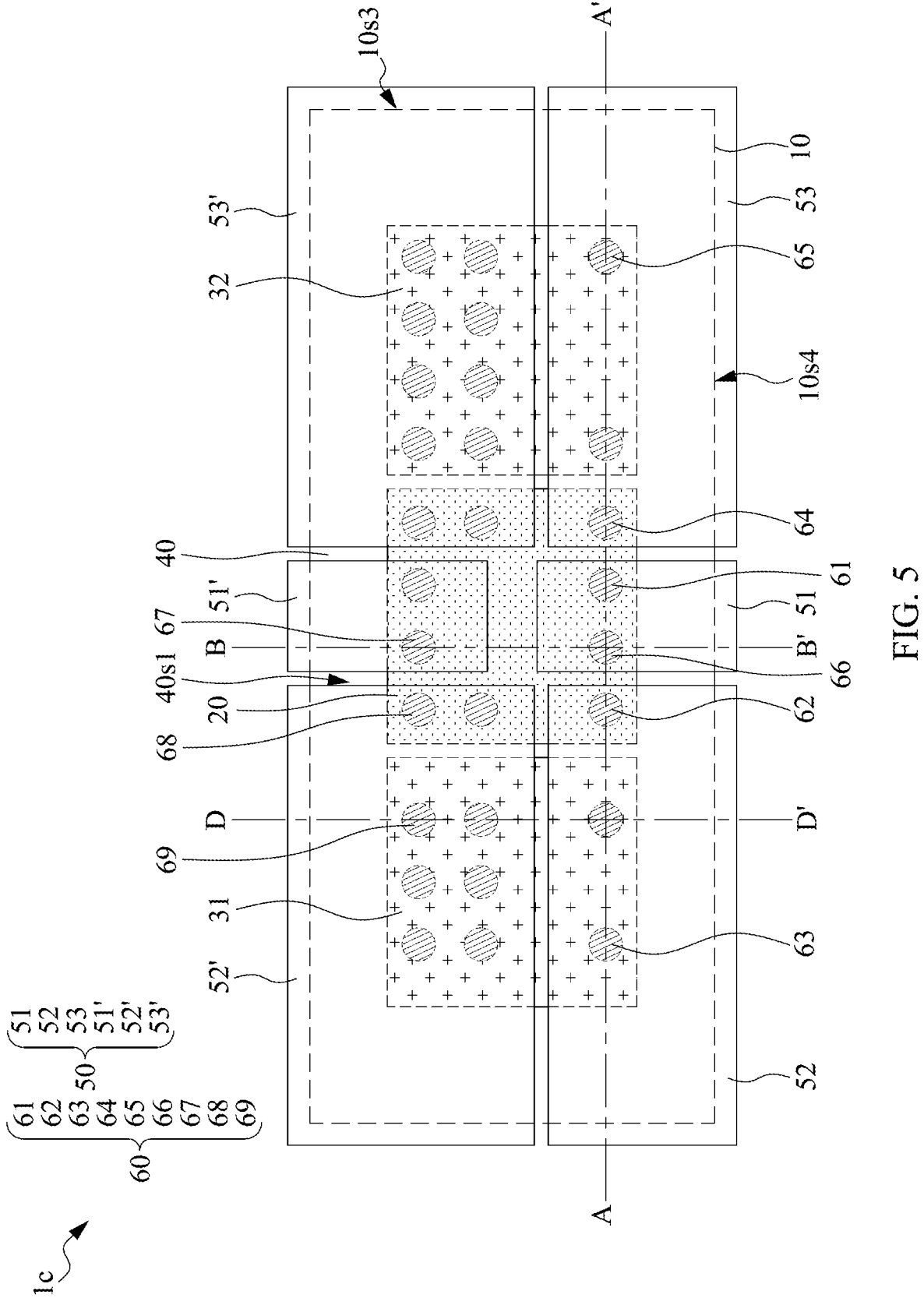
FIG. 5 is a top view of an electronic device, in accordance with an embodiment of the present disclosure.
Figure 6A:
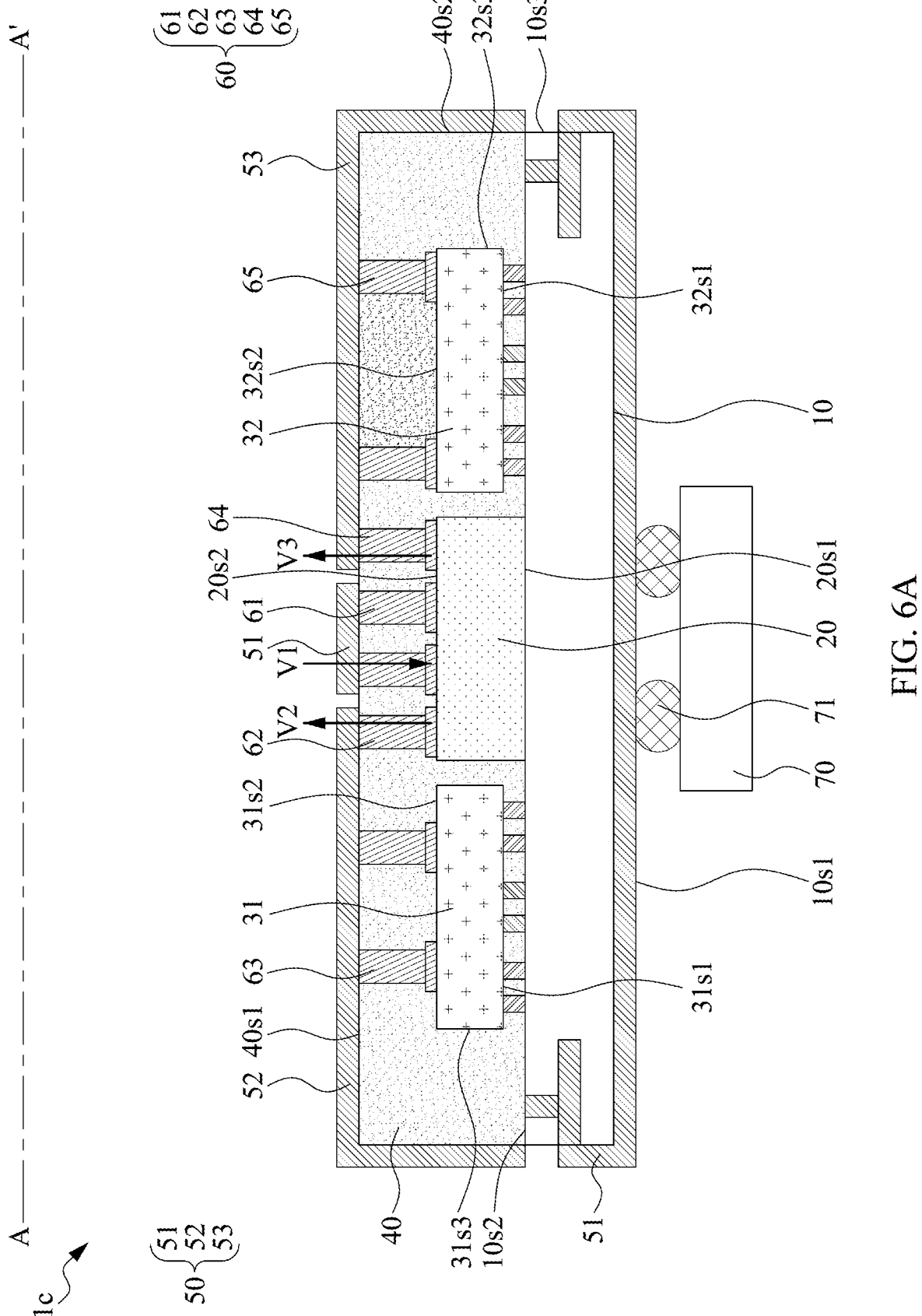
FIG. 6A is a cross-sectional view along line A-A' of the electronic device as shown in FIG. 5, in accordance with an embodiment of the present disclosure.
Figure 6B:
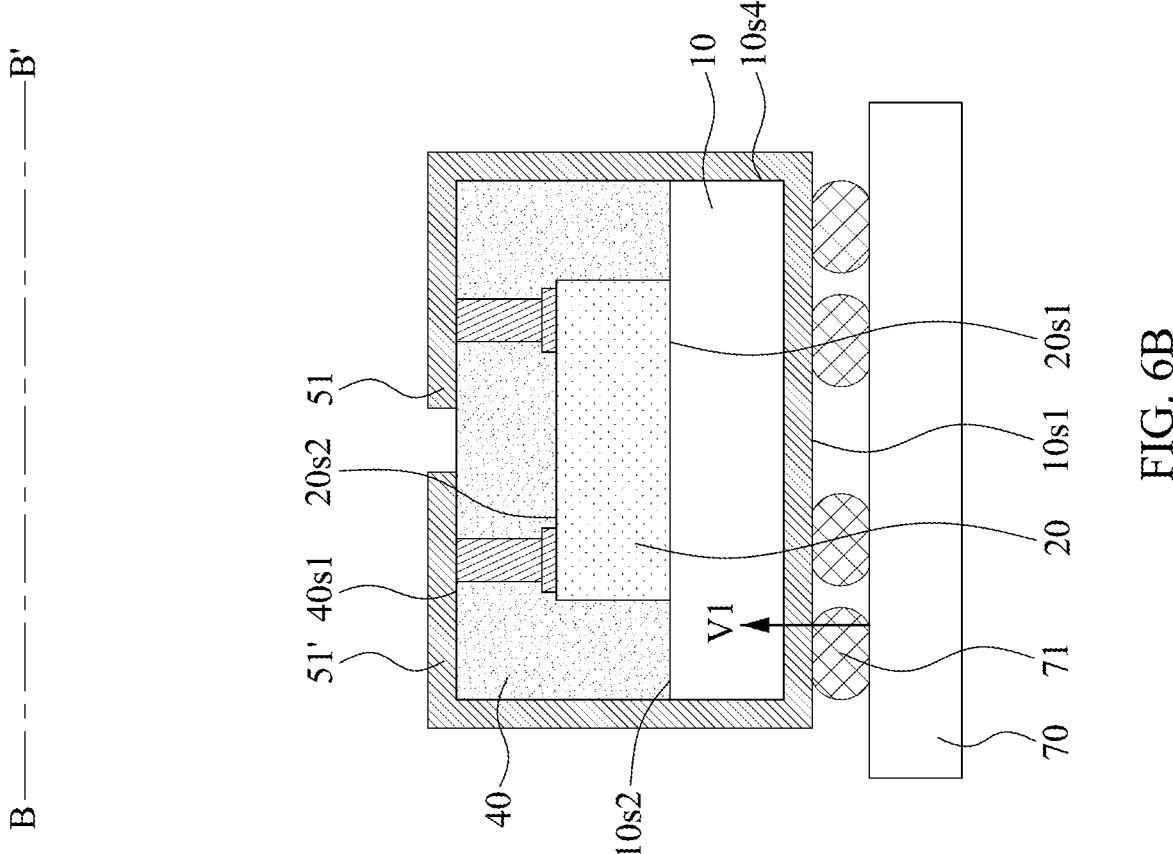
FIG. 6B is a cross-sectional view along line B-B' of the electronic device as shown in FIG. 5, in accordance with an embodiment of the present disclosure.
Figure 6B:

FIG. 5 is a top view of an electronic device 1$c$, in accordance with an embodiment of the present disclosure. FIG. 6A and FIG. 6B are cross-sectional views along line A-A' and B-B' of the electronic device 1$c$ as shown in FIG. 5, respectively. The electronic device 1$c$ is similar to the electronic device 1$a$, and the differences therebetween are described below.

In some embodiments, the surface 10$s$3 of the substrate 10 may be covered by the conductive element 51. In some embodiments, a portion of the substrate 10 may be exposed by the conductive structure 50 as shown in FIG. 6A. In some embodiments, the surface 10$s$3 of the substrate 10 may be exposed by the conductive element 52 (or 53) as shown in FIG. 6A. In some embodiments, the surface 40$s$2 of the encapsulant 40 may be covered by the conductive element 52. In some embodiments, the surface 40$s$2 of the encapsulant 40 may be covered by the conductive element 53.

Figure 6C:
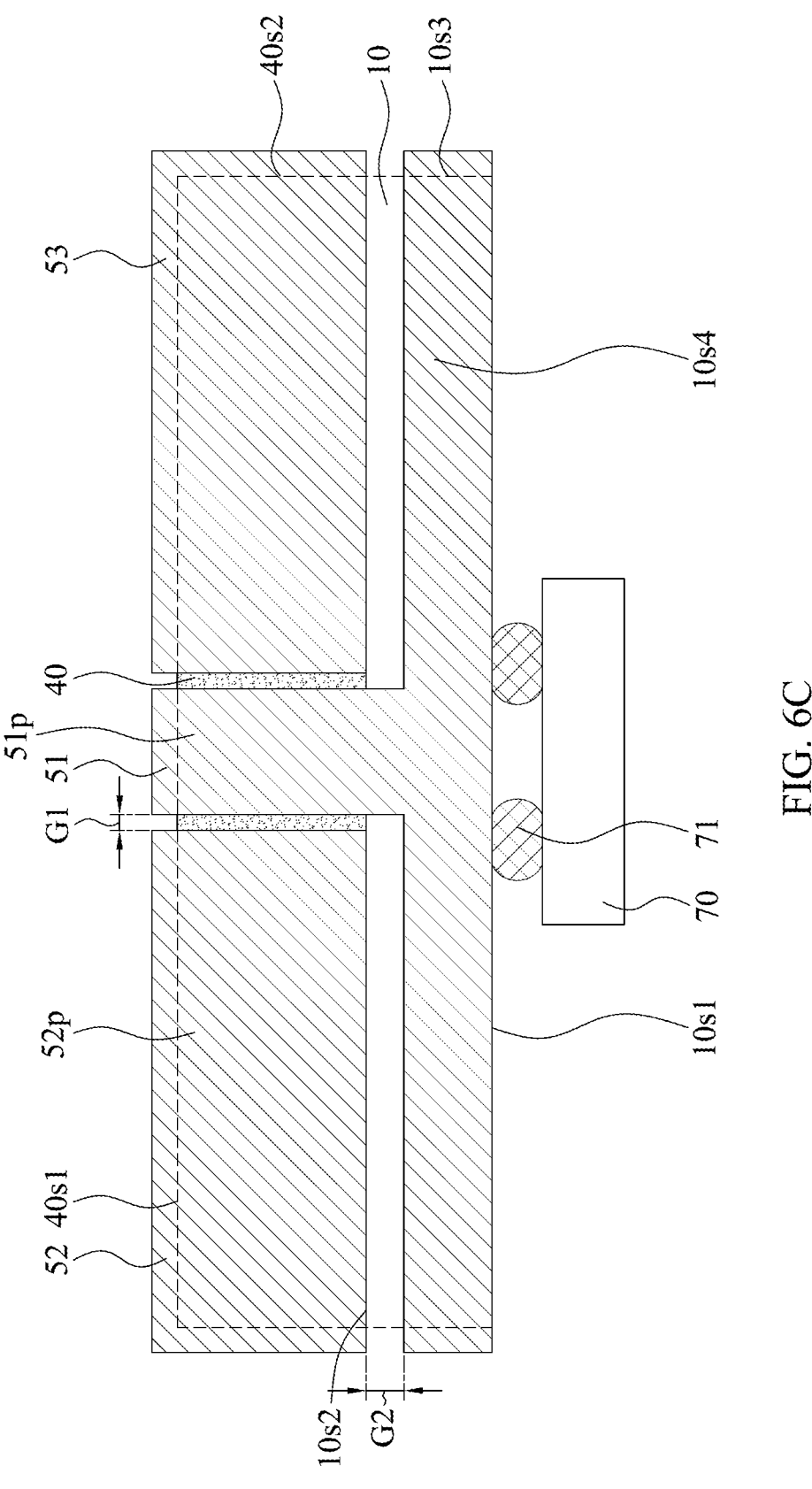
FIG. 6C is a side view of the electronic device as shown in FIG. 5, in accordance with an embodiment of the present disclosure.

FIG. 6C is a side view of the electronic device 1$c$ as shown in FIG. 5, in accordance with an embodiment of the present disclosure.

In some embodiments, the conductive element 51 may vertically overlap the conductive element 52. In some embodiments, the conductive element 51 may vertically overlap the conductive element 53. In some embodiments, an exposed portion of the encapsulant 40 may extend between the conductive elements 51 and 52 along a horizontal direction. In some embodiments, an exposed portion of the encapsulant 40 may extend between the conductive elements 51 and 53 along a horizontal direction. In some embodiments, an exposed portion of the substrate 10 may extend between the conductive elements 51 and 52 along a vertical direction. In some embodiments, an exposed portion of the substrate 10 may extend between the conductive elements 51 and 53 along a vertical direction. The conductive element 51 has an extending portion 51$p$ on the surface 10$s$4 of the substrate 10. The extending portion 51$p$ may be disposed on or cover a side of the voltage regulator 20. The conductive element 52 has an extending portion 52$p$ on the surface 10$s$4 of the substrate 10. The extending portion 52$p$ may be disposed on or cover a side of the electronic component 31. The extending portion 52$p$ may be configured to protect the electronic component 31 from a lateral EMI. In some embodiments, a gap G1 horizontally extends between the extending portions 51$p$ and 52$p$. In some embodiments, a gap G2 vertically extends between the extending portions 51$p$ and 52$p$.

Figure 6D:
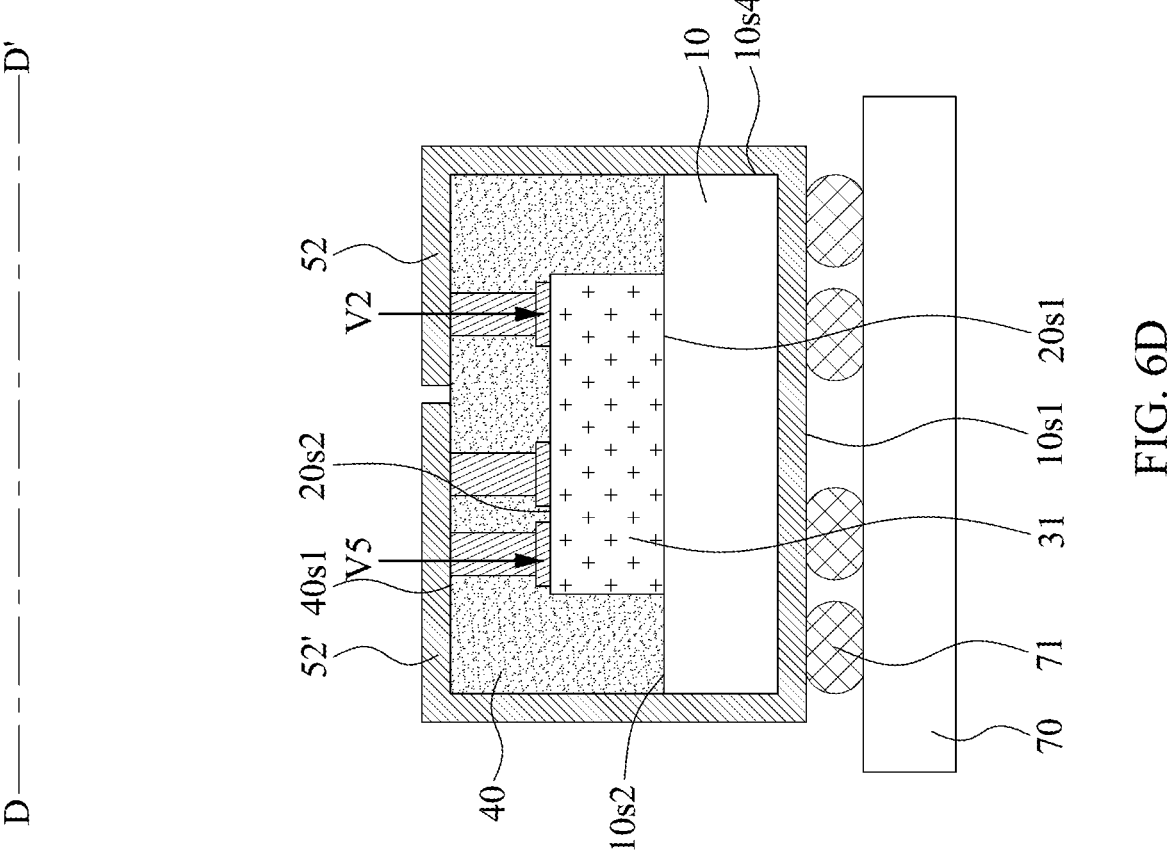
FIG. 6D is a cross-sectional view along line D-D' of the electronic device as shown in FIG. 5, in accordance with an embodiment of the present disclosure.
Figure 6D:

FIG. 6D is a cross-sectional view along line D-D' of the electronic device 1$b$ as shown in FIG. 5.

In some embodiments, the conductive element 52 may cover the surface 10$s$4 of the substrate 10. In some embodiments, the conductive element 52' may cover a lateral surface, opposite to the surface 10$s$4, of the substrate 10.

In this embodiment, the conductive element 51 have a relatively large surface area, which thereby further reduces power loss. As a result, the performance of the electronic device 1$c$ may be enhanced.

Figure 7:
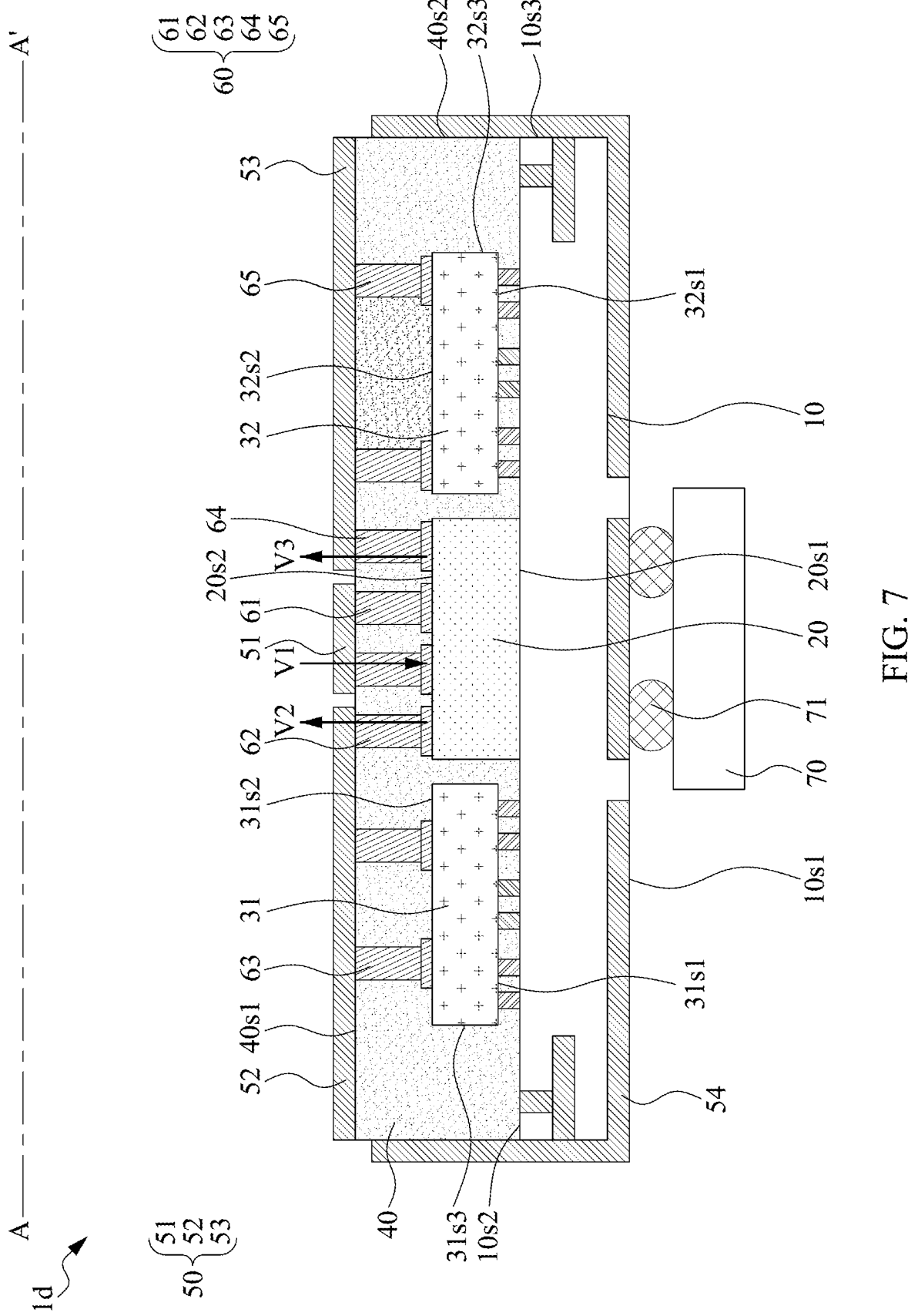
FIG. 7 is a cross-sectional view of an electronic device, in accordance with an embodiment of the present disclosure.

FIG. 7 is a cross-sectional view of an electronic device 1$d$, in accordance with an embodiment of the present disclosure. The electronic device 1$d$ is similar to the electronic device 1$a$ as shown in FIG. 2A, and the differences therebetween are described below.

In some embodiments, the electronic device 1$d$ may further include a conductive element 54. In some embodiments, the conductive element 54 may be electrically connected to ground. In some embodiments, the conductive element 54 may be spaced apart from the conductive element 51. In some embodiments, the conductive element 54 may be spaced apart from the conductive element 52. In some embodiments, the conductive element 54 may be spaced apart from the conductive element 53. In some embodiments, the conductive element 54 may cover the surface 31$s$3 of the electronic component 31. In some embodiments, the conductive element 54 may cover the surface 32$s$3 of the electronic component 32. In some embodiments, the conductive element 54 may cover the surface 40$s$2 of the encapsulant 40. In some embodiments, a portion of the surface 40$s$2 of the encapsulant 40 may be exposed by the conductive element 54. In some embodiments, the conductive element 54 may cover the surface 10s3 of the substrate 10. In some embodiments, the conductive element 54 may be in contact with the surface 10s3 of the substrate 10.

In this embodiment, the surface 31s3 of the electronic component 31 and/or surface 32s3 of the electronic component 32 may be covered by the conductive element 54. Therefore, the electronic component 31 and/or 32 may have better protection from EMI by the conductive element 54.

Figure 8:
FIG. 8 is a cross-sectional view of an electronic device, in accordance with an embodiment of the present disclosure.

FIG. 8 is a cross-sectional view of an electronic device 2a, in accordance with an embodiment of the present disclosure.

The electronic device 2a may include a substrate 81, electronic components 821, 822, and 823, conductive wires 841 and 842, voltage regulators 851, 852, 853, and 854, as well as an encapsulant 86.

The substrate 81 may have a surface 81s1 and a surface 81s2 opposite to the surface 81s1.

The electronic components 821, 822, and 823 may be disposed on the surface 81s2 of the substrate 81. The electronic component 822 may be stacked on the electronic component 821. The electronic components 821, 822, and 823 may be electrically connected to the substrate 81 by a conductive wire (e.g., 841).

The voltage regulator 851 may be disposed on the surface 81s2 of the substrate 81 and electrically connected to the substrate 81 by a conductive wire (e.g., 842).

The voltage regulator 852 may be disposed on the surface 81s2 of the substrate 81. The voltage regulator 852 may be electrically connected to the substrate 81 by flip chip bonding.

The voltage regulator 853 may be embedded in the substrate 81. The voltage regulator may be integrated with a redistribution structure (not shown in the figures) within the substrate 81.

The voltage regulator 854 may be disposed on the surface 81s1 of the substrate 81. The voltage regulator 854 may be electrically connected to the substrate 81 by flip chip bonding.

The encapsulant 86 may cover the electronic components 821, 822, and 823 as well as the voltage regulators 851 and 852.

A power signal (not shown in the figures) may be transmitted from the voltage regulator 851, 852, 853, and/or 854 to the electronic component 821, 822, and/or 823 through the substrate 81.

Figure 9A:
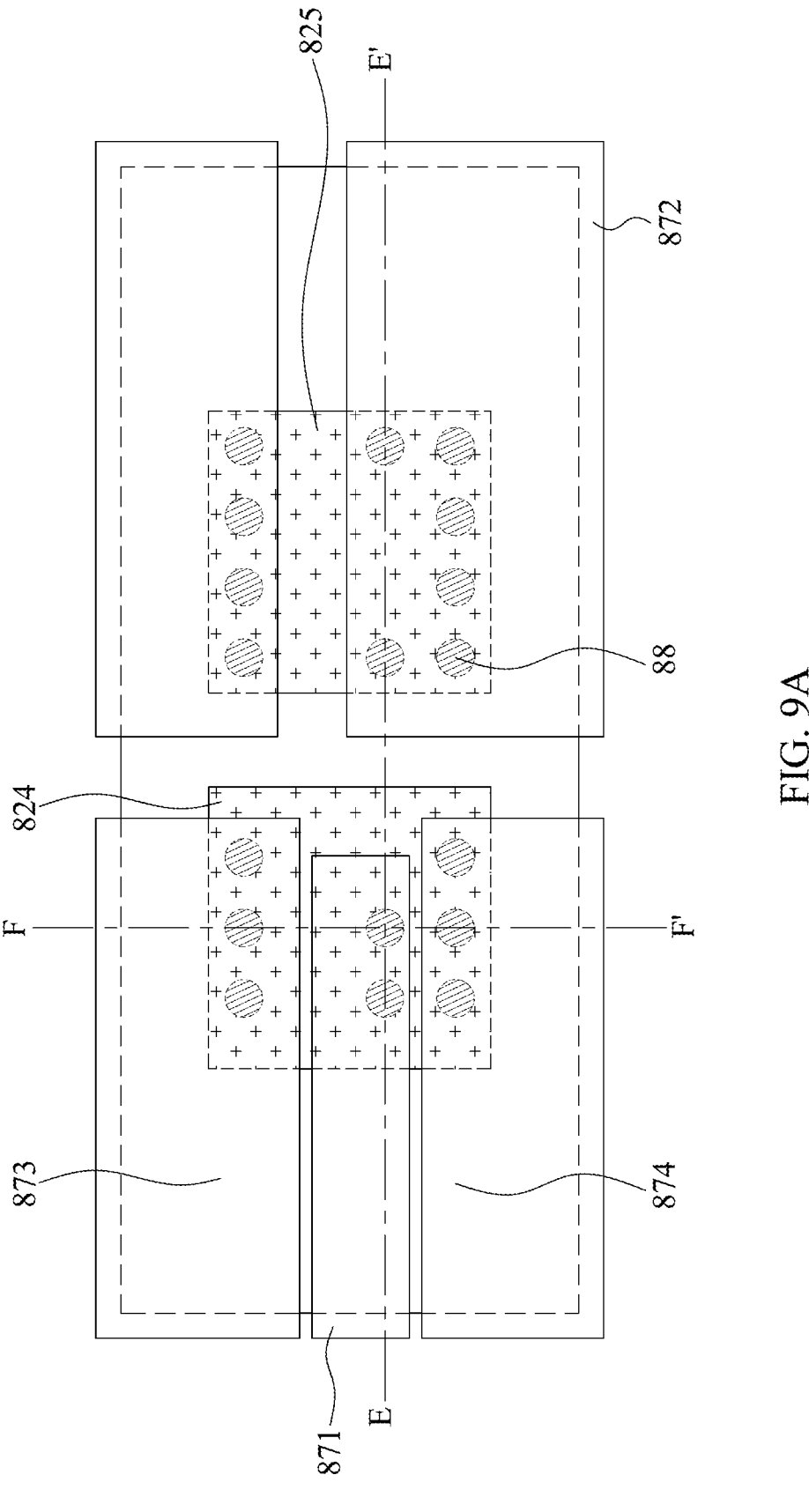
FIG. 9A is a top view of an electronic device, in accordance with an embodiment of the present disclosure.
Figure 9B:
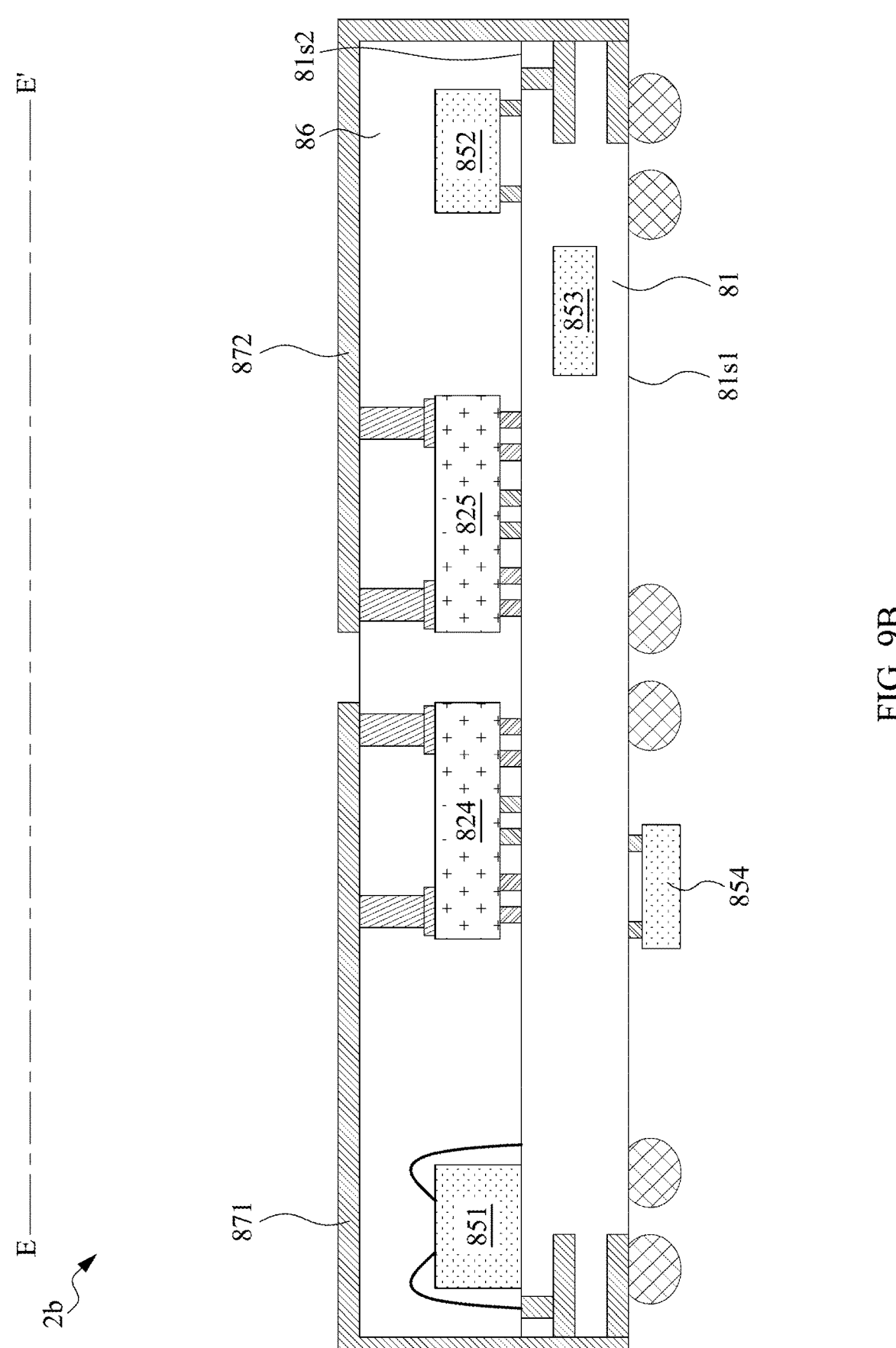
FIG. 9B is a cross-sectional view along line E-E' of the electronic device as shown in FIG. 9, in accordance with an embodiment of the present disclosure.
Figure 9C:
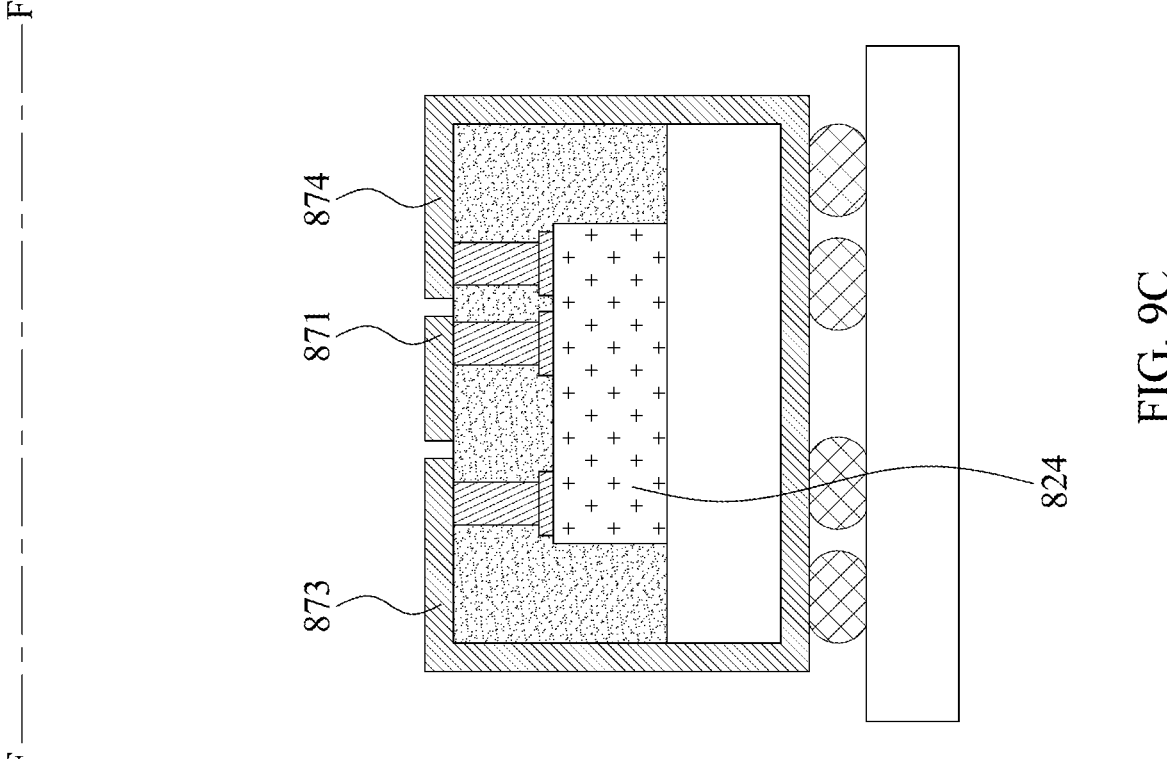
FIG. 9C is a cross-sectional view along line F-F' of the electronic device as shown in FIG. 9, in accordance with an embodiment of the present disclosure.
Figure 9C:

FIG. 9A, FIG. 9B and FIG. 9C illustrate an electronic device 2b, in accordance with an embodiment of the present disclosure. The electronic device 2b is similar to the electronic device 2a, and the differences therebetween are described below.

The electronic device 2b may include conductive elements (e.g., 871, 872, 873 and 874). The conductive elements 871, 872, 873 and 874 may be disposed on the surface 81s2 of the substrate 81. The conductive elements 871, 873 and 874 may cover an electronic component 824. The conductive element 872 may cover an electronic component 825. The conductive element 871 may cover the voltage regulator 851. The conductive element 872 may cover the voltage regulator 852.

A power signal (not shown in the figures) may pass through the voltage regulator (e.g., 851), the conductive element (e.g., 871), and the electronic component (e.g., 824). The conductive element 871 or 872 may be configured to transmit a regulated voltage.

Figure 10:
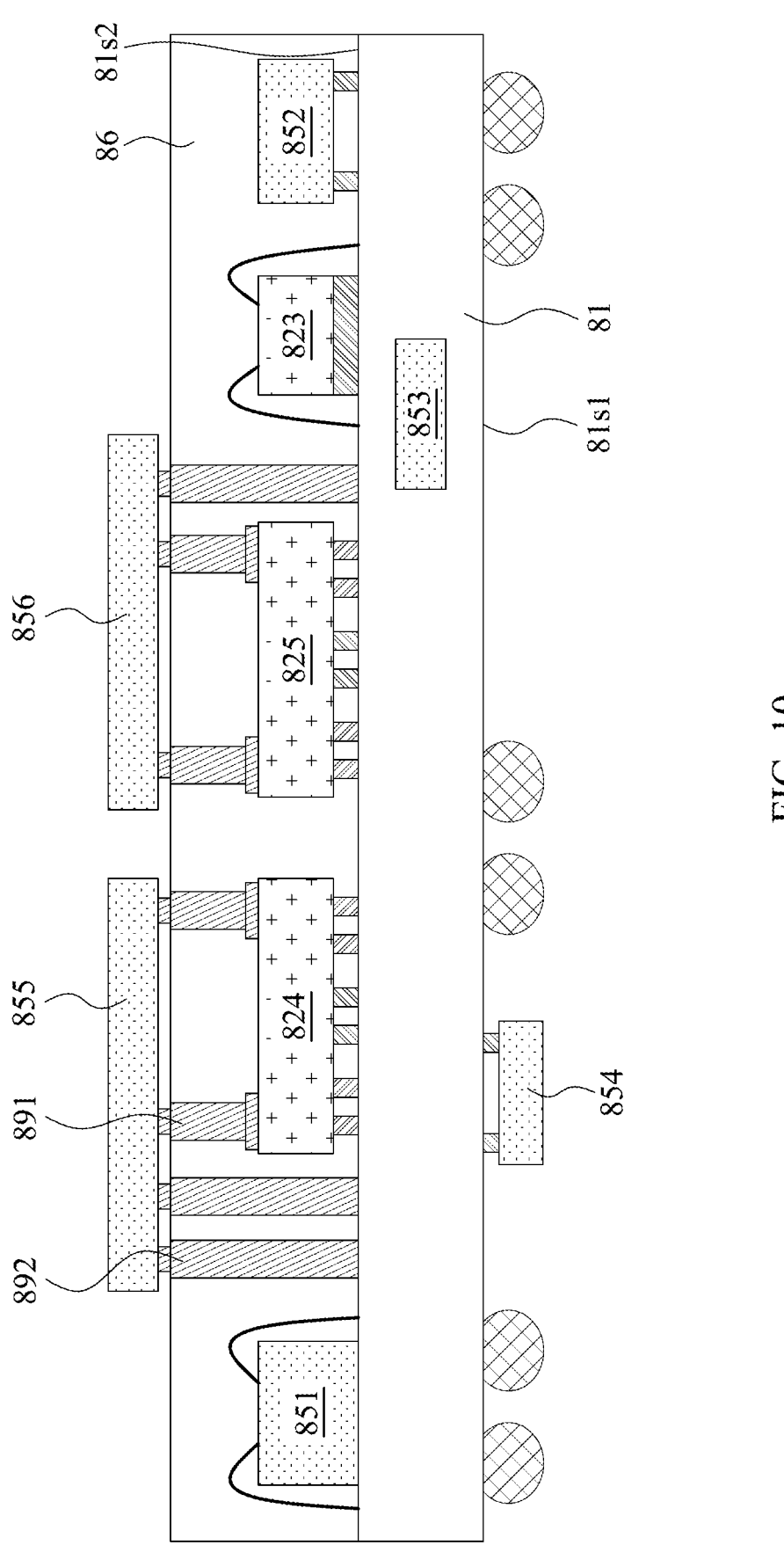
FIG. 10 is a cross-sectional view of an electronic device, in accordance with an embodiment of the present disclosure.

FIG. 10 is a cross-sectional view of an electronic device 2c, in accordance with an embodiment of the present disclosure. The electronic device 2c is similar to the electronic device 2b, and the differences therebetween are described below.

The electronic device 2c may further include voltage regulators 855 and 856 as well as conductive pillars 891 and 892.

The voltage regulators 855 and 856 may be disposed on or over the encapsulant 86. The voltage regulator 855 and/or 856 may be electrically connected to the substrate 81 through the conductive pillar 892. The voltage regulator 855 and/or 856 may be electrically connected to an electronic component (e.g., 824 or 825) through the conductive pillar 891.

A power signal (not shown in the figures) may pass through the conductive pillar (e.g., 892), voltage regulator (e.g., 855), and the electronic component (e.g., 824).

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately 10⁴ S/m, such as at least 10⁵ S/m or at least 10⁶ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a first electronic component;
a first electromagnetic interference (EMI) shielding layer; and
a voltage regulator disposed adjacent to the first electronic component, wherein the voltage regulator is configured to regulate a first voltage from the first EMI shielding layer and to provide the first electronic component with a second voltage.

2. The electronic device of claim 1, wherein a first signal path configured to transmit the second voltage is provided between the first electronic component and the voltage regulator, and the first signal path passes through a backside surface of the first electronic component.

3. The electronic device of claim 1, further comprising:
a second EMI shielding layer covering the first electronic component, wherein the second EMI shielding layer is configured to shield the first electronic component from electromagnetic interference and to transmit the second voltage to the first electronic component.

4. The electronic device of claim 3, wherein the first EMI shielding layer covers the voltage regulator and is spaced apart from the second EMI shielding layer.

5. The electronic device of claim 3, further comprising:
a third EMI shielding layer spaced apart from the second EMI shielding layer, wherein the third EMI shielding layer is configured to shield the first electronic component from electromagnetic interference, and the voltage regulator is configured to provide the first electronic component with a third voltage through the third EMI shielding layer.

6. The electronic device of claim 3, further comprising:
a fourth EMI shielding layer spaced apart from the first EMI shielding layer, wherein the voltage regulator is configured to regulate a fourth voltage from the fourth EMI shielding layer.

7. The electronic device of claim 6, wherein a potential of the fourth voltage is different from a potential of the first voltage.

8. The electronic device of claim 1, further comprising:
a second electronic component adjacent to the first EMI shielding layer, wherein the voltage regulator is configured to provide the second electronic component with a third voltage.

9. The electronic device of claim 8, wherein a second signal path configured to transmit the third voltage is provided between the second electronic component and the voltage regulator, and the second signal path passes through a backside surface of the second electronic component.

10. The electronic device of claim 9, further comprising:
a fifth EMI shielding layer disposed over the second electronic component, wherein the fifth EMI shielding layer is configured to shield the second electronic component from electromagnetic interference.

11. An electronic device, comprising:
a voltage regulator;
a first electromagnetic interference (EMI) shielding layer configured to provide the voltage regulator with an input voltage; and
a second EMI shielding layer configured to receive a first output voltage from the voltage regulator.

12. The electronic device of claim 11, further comprising:
a first electronic component configured to receive the first output voltage, wherein the second EMI shielding layer is configured to shield the first electronic component from electromagnetic interference.

13. The electronic device of claim 12, wherein the first EMI shielding layer comprises a first extending portion disposed at least one side of the voltage regulator, the second EMI shielding layer comprises a second extending portion disposed at the at least one side of the first electronic component, and a gap is located between the first extending portion and the second extending portion.

14. The electronic device of claim 11, wherein a portion of an upper surface of the voltage regulator is exposed by the first EMI shielding layer.

15. The electronic device of claim 14, wherein a portion of the upper surface of the voltage regulator is exposed by the second EMI shielding layer.

16. The electronic device of claim 11, further comprising a third EMI shielding layer spaced apart from the first EMI shield layer and the second EMI shielding layer, wherein the third EMI shielding layer is electrically connected to ground.

17. The electronic device of claim 16, further comprising:
an encapsulant having an upper surface covered by the first EMI shielding layer and the second EMI shielding layer and a lateral surface covered by the third EMI shielding layer.

18. An electronic device, comprising:
a voltage regulator;
an electronic component; and
an electromagnetic interference (EMI) shielding structure configured to shield the electronic component from electromagnetic interference, wherein the EMI shielding structure is further configured to transmit both a first voltage and a second voltage, and the second voltage is regulated from the first voltage by the voltage regulator.

19. The electronic device of claim 18, wherein the EMI shielding structure has a first portion and a second portion electrically separated from the first portion, the first portion is disposed over and electrically connected to the voltage regulator to provide the first voltage, and the second portion is disposed over and electrically connected to the electronic component to provide the second voltage.

20. The electronic device of claim 18, further comprising:

an encapsulant covering the voltage regulator and the electronic component;

a first conductive via penetrating the encapsulant and connecting the voltage regulator to the EMI shielding structure to provide the first voltage; and a second conductive via penetrating the encapsulant and connecting the electronic component to the EMI shielding structure to provide the second voltage.

\* \* \* \* \*